(12) United States Patent
Ohsawa et al.

(10) Patent No.: US 8,920,940 B2
(45) Date of Patent: *Dec. 30, 2014

(54) LIGHT-EMITTING ELEMENT AND LIGHT-EMITTING DEVICE

(75) Inventors: Nobuharu Ohsawa, Kanagawa (JP); Hideko Inoue, Kanagawa (JP); Satoshi Seo, Kanagawa (JP); Satoko Shitagaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1176 days.

This patent is subject to a terminal disclaimer.

(21) Appl. No.: 11/434,849

(22) Filed: May 16, 2006

(65) Prior Publication Data

US 2006/0263637 A1 Nov. 23, 2006

(30) Foreign Application Priority Data

May 20, 2005 (JP) .................. 2005-148787

(51) Int. Cl.
| | |
|---|---|
| H01L 51/54 | (2006.01) |
| H05B 33/12 | (2006.01) |
| H01L 51/00 | (2006.01) |
| H05B 33/14 | (2006.01) |
| C09K 11/06 | (2006.01) |
| H01L 51/50 | (2006.01) |

(52) U.S. Cl.
CPC ......... *H01L 51/0085* (2013.01); *H01L 51/5016* (2013.01); *H05B 33/14* (2013.01); *C09K 2211/1029* (2013.01); *C09K 2211/1044* (2013.01); *C09K 11/06* (2013.01); *C09K 2211/185* (2013.01); *Y10S 428/917* (2013.01)
USPC ........ 428/690; 428/917; 428/411.1; 428/336; 548/101; 548/103

(58) Field of Classification Search
USPC ......................................... 428/690
See application file for complete search history.

(56) References Cited

U.S. PATENT DOCUMENTS 6,277,503 B1 * 8/2001 Hashimoto et al. ........... 428/690
6,841,267 B2 * 1/2005 Brown et al. .................. 428/690
(Continued)

FOREIGN PATENT DOCUMENTS

EP 1 690 866 A1 8/2006
EP 2 336 143 A1 6/2011
(Continued)

OTHER PUBLICATIONS

Tang, C.W. et al, "Organic Electroluminescent Diodes," Applied Physics Letters, vol. 51, No. 12, pp. 913-915, Sep. 21, 1987.

(Continued)

*Primary Examiner* — J. L. Yang
(74) *Attorney, Agent, or Firm* — Husch Blackwell LLP

(57) ABSTRACT

In a light emitting element using an organic metal complex which can convert an excited triplet state into a light emission, a red color light emitting element exhibiting a high light emission efficiency and an excellent color purity is provided. A material used in a hole transporting layer and a host contained in a light emitting layer and an electron transporting layer has a triplet excitation energy larger than a triplet excitation energy of the organic metal complex which is a light emitting substance to enable a current efficiency and an external quantum efficiency of the light emitting element to be improved. It is possible to obtain a current efficiency of 2.0 cd/A or more and an external quantum efficiency of 5% or more. The color purity is excellent. The CIE chromaticity coordinate is X≥0.7 and Y≤0.3 to make it possible to exceed an NTSC standard.

18 Claims, 19 Drawing Sheets

(56) References Cited

U.S. PATENT DOCUMENTS

| | | | |
|---|---|---|---|
| 7,238,806 B2 | 7/2007 | Inoue et al. | |
| 7,771,844 B2 | 8/2010 | Inoue et al. | |
| 7,795,429 B2 * | 9/2010 | Inoue et al. | 544/353 |
| 7,811,677 B2 | 10/2010 | Ohsawa et al. | |
| 7,915,409 B2 | 3/2011 | Inoue et al. | |
| 7,951,471 B2 | 5/2011 | Inoue et al. | |
| 8,512,880 B2 * | 8/2013 | Inoue et al. | 428/690 |
| 2002/0086180 A1 * | 7/2002 | Seo et al. | 428/690 |
| 2005/0024339 A1 * | 2/2005 | Yamazaki et al. | 345/169 |
| 2005/0048317 A1 * | 3/2005 | Seo et al. | 428/690 |
| 2005/0119485 A1 * | 6/2005 | Brown et al. | 546/2 |
| 2005/0146551 A1 * | 7/2005 | Yamazaki et al. | 347/20 |
| 2005/0191527 A1 * | 9/2005 | Fujii et al. | 428/917 |
| 2007/0200125 A1 * | 8/2007 | Ikeda et al. | 257/94 |
| 2011/0024732 A1 | 2/2011 | Ohsawa et al. | |
| 2011/0163665 A1 | 7/2011 | Inoue et al. | |
| 2011/0196152 A1 | 8/2011 | Inoue et al. | |

FOREIGN PATENT DOCUMENTS

| | | |
|---|---|---|
| JP | 2005-239648 | 9/2005 |
| JP | 2006-73992 | 3/2006 |
| JP | 2006-182775 | 7/2006 |
| JP | 2006-188491 | 7/2006 |
| WO | WO 2005/031798 A2 * | 4/2005 |
| WO | WO 2005/054261 A1 | 6/2005 |
| WO | WO 2005/115061 A1 | 12/2005 |
| WO | WO 2006/062144 A1 | 6/2006 |

OTHER PUBLICATIONS

Duan, J.P. et al, "New Iridium Complexes as Highly Efficient Orange-Red Emitters in Organic Light-Emitting Diodes," Advanced Materials, vol. 15, No. 3, pp. 224-228, Feb. 5, 2003.

Tsutsui, T., "The Operation Mechanism and the Light Emission Efficiency of the Organic EL Element," Textbook for the 3$^{rd}$ Workshop, Division of Molecular Electronics and Bioelectronics, Japan Society of Applied Physics, pp. 31-37 (1993); with complete English translation (11 pages).

Hwang, F.-M. et al, "Iridium(III) Complexes with Orthometalated Quinoxaline Ligands: Subtle Tuning of Emission to the Saturated red Color," Inorganic Chemistry, vol. 44, No. 5, Feb. 4, 2005, pp. 1344-1353.

Seo, S. et al, "P-132: Long-Lived Deeply Red Phosphorescent OLEDs Based on Electrochemically Stable Ir Complexes," SID Digest '05: SID International Symposium Digest of Technical Papers, vol. 36, 2005, pp. 806-809.

* cited by examiner

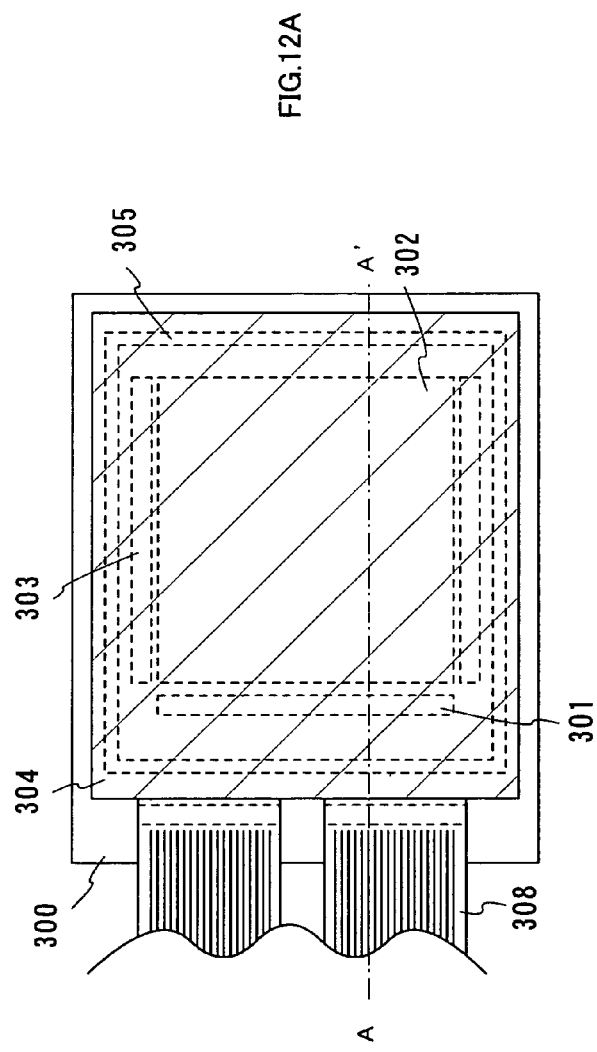
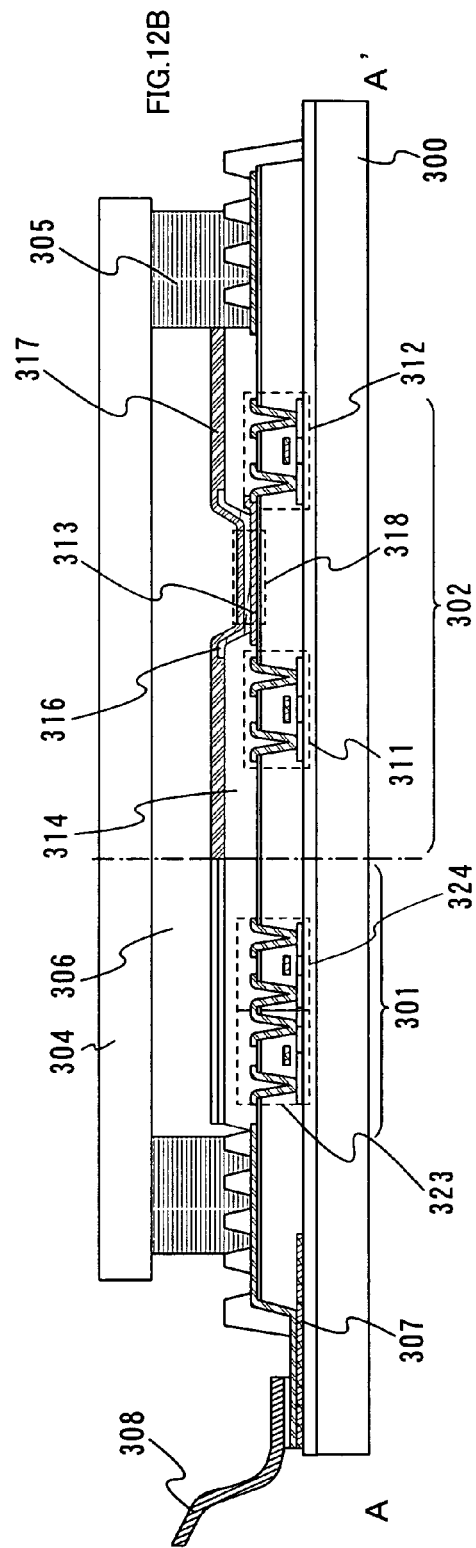

FIG.13A
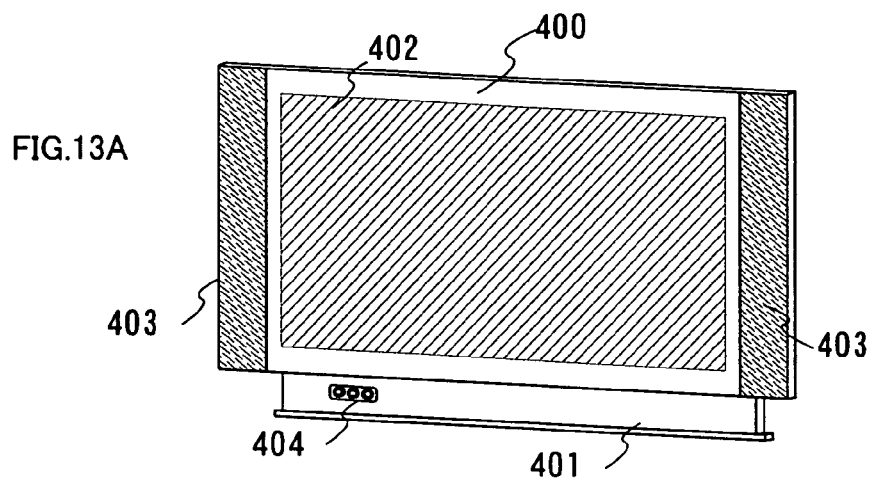
FIG.13B
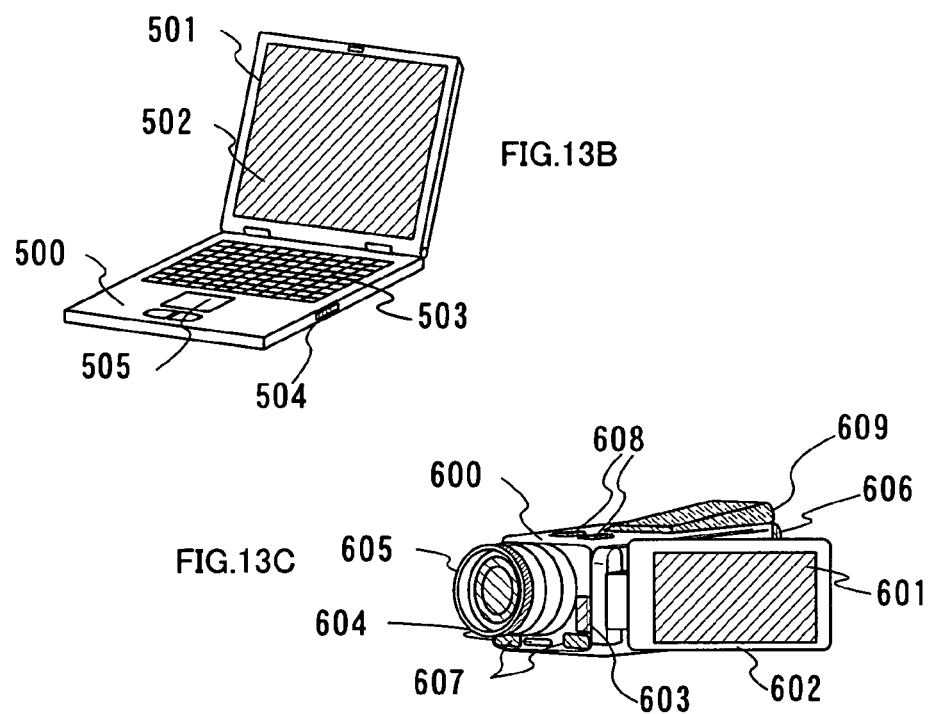
FIG.13C
FIG.13D
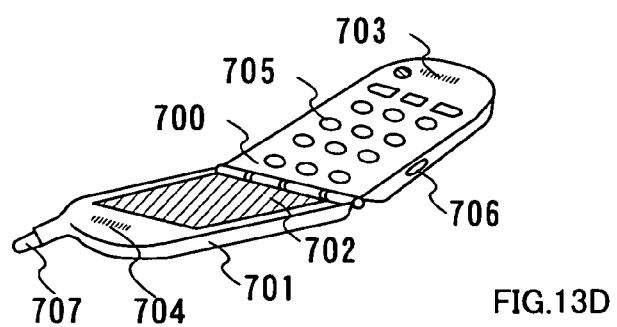

LIGHT-EMITTING ELEMENT AND LIGHT-EMITTING DEVICE

BACKGROUND OF THE INVENTION

1. Field of the Invention

The present invention relates to an organometallic complex that is capable of converting an excited triplet state into luminescence, a light-emitting element using the organometallic complex, and a light-emitting device using the light-emitting element.

2. Description of the Related Art

A light-emitting element using an organic compound is an element in which a layer including an organic compound or an organic compound film emits light by applying an electric field. The emission mechanism is said to be as follows: when a voltage is applied between electrodes with an organic compound film interposed therebetween, an electron injected from a cathode and a hole injected from an anode are recombined in the organic compound film to form a molecular exciton, and energy is released to emit light when the molecular exciton returns to the ground state.

In such a light-emitting element, generally, an organic compound film is formed to be a thin film of less than 1 μm. In addition, since such a light-emitting element is a self-luminous element in which the organic compound itself emits light, a backlight as used for a conventional liquid crystal display is not necessary. Therefore, such a light-emitting element has a great advantage of being able to be manufactured to be thin and lightweight. In addition, for example, in an organic compound film on the order of 100 to 200 nm, the time from injection of carriers to recombination is approximately several tens of nanoseconds in consideration of the carrier mobility of the organic compound film, and light gets to be emitted approximately within microseconds even when the process from the recombination of the carriers to light emission is included. Therefore, it is also one of features that the response speed is quite fast. Further, since such a light-emitting element is a carrier-injection type light-emitting element, driving by a direct voltage is possible, and noise is not easily generated. As for the driving voltage, a sufficient luminance of 100 cd/m$^2$ is achieved at 5.5 V when an organic compound film is a uniform ultra thin film approximately 100 nm in thickness, an electrode material is selected so as to reduce the carrier injection barrier for the organic compound film, and further, a hetero structure (a two-layer structure here) is introduced (for example, Reference 1: C. W. Tang, et al., Applied Physics Letters, vol. 51, No. 12, pp. 913-915 (1987)).

In addition to such element characteristics such as slimness, lightweight, high-speed response, and direct-current low-voltage driving, it can be also said to be one of great advantages that the luminescent color of a light-emitting element using an organic compound is rich in variation, and the factor is the variety of organic compound themselves. Namely, the flexibility of being able to develop materials for various luminescent colors by molecular design (for example, introduction of a substituent) or the like produces richness of colors. It can be said that the biggest application field of a light-emitting element utilizing this richness of colors is a full-color flat-panel display because there are a lot of organic compounds capable of emitting light's primary colors of red, green, and blue, and thus, full-color images can be achieved easily by patterning of the organic compounds.

It can be said that the above-described element characteristics such as slimness, lightweight, high-speed response, and direct-current low-voltage driving are also appropriate characteristics for a flat-panel display. However, in recent years, the use of not fluorescent materials but phosphorescent materials has been tried as an attempt to further improve a luminous efficiency. In a light-emitting element using an organic compound, luminescence is produced when a molecular exciton returns to the ground state, where the luminescence can be luminescence (fluorescence) from an excited singlet state (S*) or luminescence (phosphorescence) from an excited triplet state (T*). When a fluorescent material is used, only luminescence (fluorescence) from S* contributes.

However, it is commonly believed that the statistical generation ratio between S* and T* of a light-emitting element is S*:T*=1:3 (for example, Reference 2: Tetsuo TSUTSUI, Textbook for the 3rd Workshop, Division of Molecular Electronics and Bioelectronics, Japan Society of Applied Physics, p. 31 (1993)). Accordingly, in the case of a light-emitting element using a fluorescent material, the theoretical limit of the internal quantum efficiency (the ratio of generated photons to injected carriers) is considered to be 25% on the ground of S*:T*=1:3. In other words, in the case of a light-emitting element using a fluorescent material, at least 75% of injected carriers are wasted uselessly.

Conversely, it is believed that the luminous efficiency is improved (simply, 3 to 4 times) if luminescence from T*, that is, phosphorescence can be used. However, in the case of a commonly used organic material, luminescence (phosphorescence) from T* is not observed at room temperature, and normally, only luminescence (fluorescence) from S* is observed. In reality, in recent years, light-emitting elements in which energy (hereinafter, referred to as "triplet excitation energy") that is emitted on returning from T* to a ground state can be converted into luminescence have been released one after another, and the high luminous efficiency has attracted attentions (for example, Reference 3: J. Duan et al. Advanced Materials, 2003, 15, No. 3, Feb. 5 pp. 224-228).

SUMMARY OF THE INVENTION

In Reference 3, an iridium complex using a dibenzo[f,h]quinoxaline derivative for a ligand is synthesized and is used as a light-emitting substance of a light-emitting element. The obtained light-emitting element has high luminous efficiency; however, the luminescent color is orange-red, and red light with high color purity is not realized.

It is an object of the present invention to provide a red light-emitting element which exhibits high luminous efficiency and excellent color purity in a light-emitting element using an organometallic complex that is capable of converting an excited triplet state into luminescence. Further, it is another object of the present invention to a light-emitting device which can provide colorful images by emitting much more colors by using the red light-emitting element which has excellent color purity.

In order to achieve the foregoing objects, the present invention takes the following means.

A mode of the present invention is a light-emitting element comprising a hole transporting layer, a light-emitting layer, an electron transporting layer, an electron injecting layer, and a second electrode which are stacked sequentially over a first electrode, wherein the light-emitting layer includes an organometallic complex having a structure represented by the following general formula (1), and wherein the electron injecting layer includes an organic compound and a substance showing an electron donating property to the organic compound.

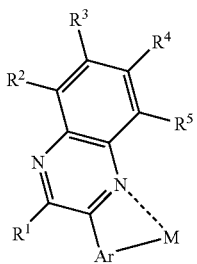

(1)

In the formula (1), $R^1$ to $R^5$ are individually either hydrogen, a halogen element, an acyl group, an alkyl group, an alkoxyl group, an aryl group, a cyano group, or a heterocyclic group. Ar represents either an aryl group or a heterocyclic group. M is either an element of Group 9 or an element of Group 10. Ar is preferably either an aryl group having an electron withdrawing group or a heterocyclic group having an electron withdrawing group. When Ar is either an aryl group having an electron withdrawing group or a heterocyclic group having an electron withdrawing group, phosphorescence having higher luminous intensity can be emitted.

A mode of the present invention is a light-emitting element comprising a hole transporting layer, a light-emitting layer, an electron transporting layer, an electron injecting layer, and a second electrode which are stacked sequentially over a first electrode, wherein the light-emitting layer includes an organometallic complex having a structure represented by the following general formula (2), and wherein the electron injecting layer includes an organic compound and a substance showing an electron donating property to the organic compound.

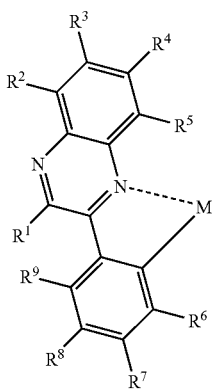

(2)

In the formula (2), $R^1$ to $R^9$ are individually either hydrogen, a halogen element, an acyl group, an alkyl group, an alkoxyl group, an aryl group, a cyano group, or a heterocyclic group. Any one of $R^6$ to $R^9$ represents an electron withdrawing group, and M is either an element of Group 9 or an element of Group 10. Since any one of $R^6$ to $R^9$ is a group having an electron withdrawing group, phosphorescence having higher luminous intensity can be emitted.

A mode of the present invention is a light-emitting element comprising a hole transporting layer, a light-emitting layer, an electron transporting layer, an electron injecting layer, and a second electrode which are stacked sequentially over a first electrode, wherein the light-emitting layer includes an organometallic complex having a structure represented by the following general formula (3), and wherein the electron injecting layer includes an organic compound and a substance showing an electron donating property to the organic compound.

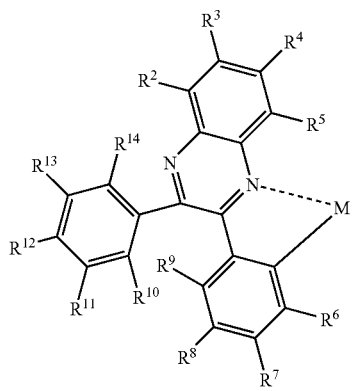

(3)

In the formula (3), $R^2$ to $R^{14}$ are individually either hydrogen, a halogen element, an acyl group, an alkyl group, an alkoxyl group, an aryl group, a cyano group, a heterocyclic group, or an electron withdrawing group. In addition, M is either an element of Group 9 or an element of Group 10. At least one of $R^6$ to $R^9$ is preferably an electron withdrawing group, and thus, phosphorescence having higher luminous intensity can be emitted.

A mode of the present invention is a light-emitting element comprising a hole transporting layer, a light-emitting layer, an electron transporting layer, an electron injecting layer, and a second electrode which are stacked sequentially over a first electrode, wherein the light-emitting layer includes an organometallic complex having a structure represented by the following general formula (4), and wherein the electron injecting layer includes an organic compound and a substance showing an electron donating property to the organic compound.

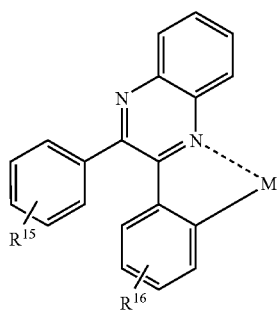

(4)

In the formula (4), $R^{15}$ and $R^{16}$ are individually either hydrogen, a halogen element, an acyl group, an alkyl group, an alkoxyl group, an aryl group, a cyano group, a heterocyclic group or an electron withdrawing group; and M is either an element of Group 9 or an element of Group 10. $R^{16}$ is preferably an electron withdrawing group, and thus, phosphorescence having higher luminous intensity can be emitted.

A mode of the present invention is a light-emitting element comprising a hole transporting layer, a light-emitting layer, an electron transporting layer, an electron injecting layer, and a second electrode which are stacked sequentially over a first electrode, wherein the light-emitting layer includes an organometallic complex represented by the following general formula (5), and wherein the electron injecting layer includes an organic compound and a substance showing an electron donating property to the organic compound.

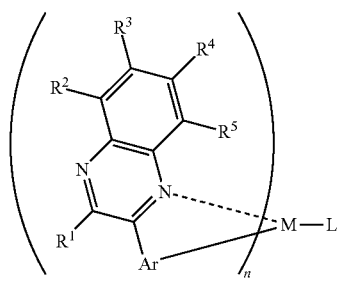

(5)

In the formula (5), $R^1$ to $R^5$ are individually either hydrogen, a halogen element, an acyl group, an alkyl group, an alkoxyl group, an aryl group, a cyano group, or a heterocyclic group; Ar is either an aryl group having an electron withdrawing group or a heterocyclic group having an electron withdrawing group; M is either an element of Group 9 or an element of Group 10, n=2 when the M is an element of Group 9 while n=1 when the M is an element of Group 10, and L is a monoanionic ligand. Since Ar is an electron withdrawing group, phosphorescence having higher luminous intensity can be emitted.

A mode of the present invention is a light-emitting element comprising a hole transporting layer, a light-emitting layer, an electron transporting layer, an electron injecting layer, and a second electrode which are stacked sequentially over a first electrode, wherein the light-emitting layer includes an organometallic complex having a structure represented by the following general formula (6), and wherein the electron injecting layer includes an organic compound and a substance showing an electron donating property to the organic compound.

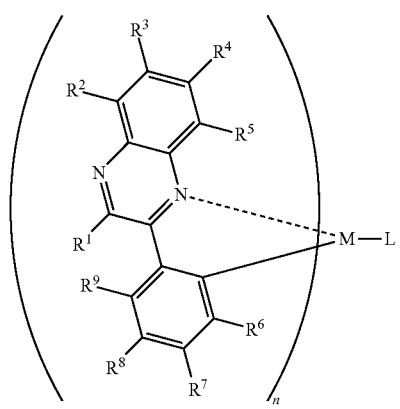

(6)

In the formula (6), $R^1$ to $R^5$ are individually either hydrogen, a halogen element, an acyl group, an alkyl group, an alkoxyl group, an aryl group, a cyano group, or a heterocyclic group, and $R^6$ to $R^9$ individually represent either hydrogen, an acyl group, an alkyl group, an alkoxyl group, an aryl group, a heterocyclic group or an electron withdrawing group. At least one of $R^6$ to $R^9$ is preferably an electron withdrawing group. M is one of an element of Group 9 and an element of Group 10, n=2 when the M is an element of Group 9 while n=1 when the M is an element of Group 10. L is any one of a monoanionic ligand having a β-diketone structure, a monoanionic bidentate ligand having a carboxyl group, and a monoanionic bidentate ligand having a phenolic hydroxyl group. When at least one of $R^6$ to $R^9$ is an electron-withdrawing group, phosphorescence with higher emission intensity can be emitted.

Note that a case is excluded, where in the organometallic shown in the formula (6), when $R^1$ to $R^9$ are hydrogen and the anionic ligand L is an acetylacetoneanion, or where at least one of $R^6$ to $R^9$ does is not an electron-withdrawing group.

A mode of the present invention is a light-emitting element comprising a hole transporting layer, a light-emitting layer, an electron transporting layer, an electron injecting layer, and a second electrode which are stacked sequentially over a first electrode, wherein the light-emitting layer includes an organometallic complex represented by the following general formula (7), and wherein the electron injecting layer includes an organic compound and a substance showing an electron donating property to the organic compound.

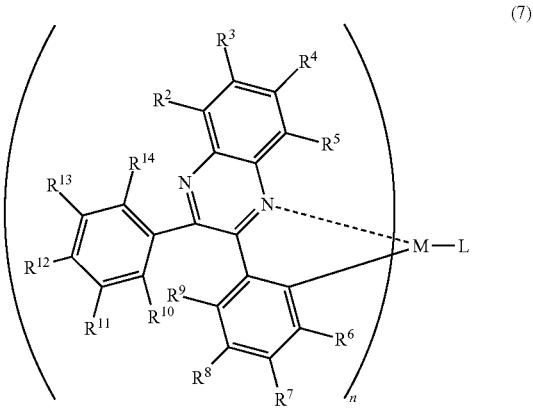

(7)

In the formula (7), $R^2$ to $R^{14}$ individually represent either hydrogen, a halogen element, an acyl group, an alkyl group, an alkoxyl group, an aryl group, a cyano group, a heterocyclic group or an electron withdrawing group. M is one of an element of Group 9 and an element of Group 10, n=2 when the M is an element of Group 9 while n=1 when the M is an element of Group 10, and L is an anionic ligand. Here, at least one of $R^6$ to $R^9$ is preferably an electron withdrawing group. Thus, phosphorescence with higher emission intensity can be emitted.

A mode of the present invention is a light-emitting element comprising a hole transporting layer, a light-emitting layer, an electron transporting layer, an electron injecting layer, and a second electrode which are stacked sequentially over a first electrode, wherein the light-emitting layer includes an organometallic complex represented by the following general formula (8), and wherein the electron injecting layer includes an organic compound and a substance showing an electron donating property to the organic compound.

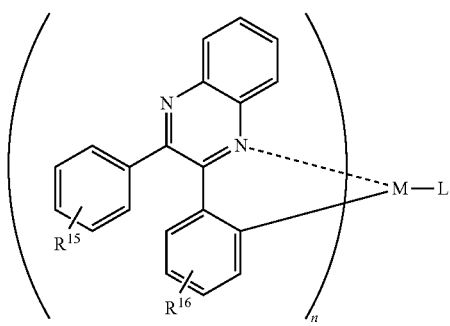

(8)

In the formula (8), $R^{15}$ and $R^{16}$ individually represent either hydrogen, a halogen element, an acyl group, an alkyl group, an alkoxyl group, an aryl group, a cyano group, a heterocyclic group or an electron withdrawing group. M is one of an element of Group 9 and an element of Group 10, n=2 when the M is an element of Group 9 while n=1 when the M is an element of Group 10, and L is an anionic ligand. Here, $R^{16}$ is preferably an electron withdrawing group. Thus, phosphorescence with higher emission intensity can be emitted.

Further, the anionic ligand L may be any one of ligands represented by the following formulas (9) to (15).

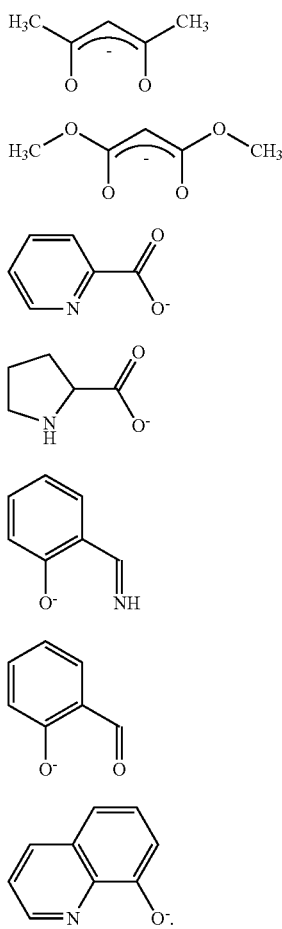

The anionic ligand L may be an anionic ligand having a β-diketone structure, an anionic bidentate ligand having a carboxyl group, and an anionic bidentate ligand having a phenolic hydroxyl group.

The substance showing an electron donating property is a metal having a low work function The metal may be any one of Li, Mg and Cs.

The light-emitting element may have a feature that a current efficiency is 2.0 cd/A or higher and a CIE chromaticity coordinate is X≥0.7 and Y≤0.3.

The light-emitting element may have a feature that an external quantum efficiency is 5% or more and a CIE chromaticity coordinate is X≥0.7 and Y≤0.3

The electron transporting layer may have a triplet excitation energy higher than the organometallic complex.

The hole transporting layer may have a triplet excitation energy higher than the organometallic complex.

The light-emitting layer may include a host material having a triplet excitation energy higher than the organometallic complex By the present invention, a light-emitting element which exhibits high luminous efficiency and excellent color purity can be provided. In addition, by using a light-emitting element having excellent color purity, a light-emitting device which can provide colorful images by emitting much more colors can be manufactured.

BRIEF DESCRIPTION OF THE DRAWINGS

In the accompanying drawings:

FIGS. 12A and 12B show a display device using a light-emitting element according to an aspect of the present invention;

FIGS. 13A to 13D each show an electronic device using a light-emitting element according to an aspect of the present invention;

DETAILED DESCRIPTION OF THE INVENTION

Embodiment Modes

Figure 1:
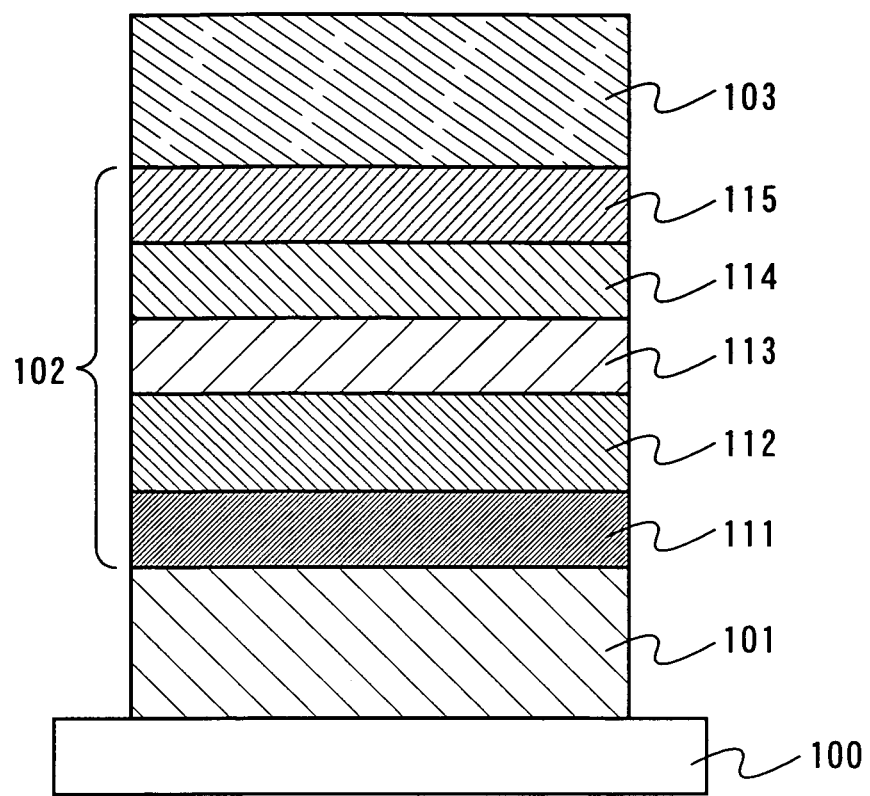
FIG. 1 shows an element structure of a light-emitting element according to an aspect of the present invention.

Hereinafter, the embodiment modes of the present invention will be described with reference to the accompanying drawings. The present invention is not limited to the following description, and it is easily understood by those skilled in the art that modes and details herein disclosed can be modified in various ways without departing from the spirit and the scope of the present invention. It should be noted that the present invention should not be interpreted as being limited to the description of the embodiment modes to be given below. Note that in structures of the present invention to given below, the same reference numerals are used for the same portions or the portions having the same functions in some cases.

Embodiment Mode 1

Embodiment Mode 1 will describe one mode of a light-emitting element of the present invention with reference to FIG. 1. As shown in FIG. 1, a first electrode 101 is formed over a substrate 100, a layer including a light-emitting substance 102 is formed over the first electrode 101, and a second electrode 103 is formed thereover. In addition, the layer including a light-emitting substance 102 is formed by stacking a plurality of layers, and the structure of Embodiment Mode 1 includes a hole injecting layer 111, a hole transporting layer 112, a light-emitting layer 113, an electron transporting layer 114 and an electron injecting layer 115. These layers can be formed by an evaporation method or a coating method.

As a material used for the substrate 100, quartz, glass, plastic, a flexible substrate or the like can be used, for example. It is to be noted that other materials may be used, so long as they can function as a support in a manufacturing process of a light-emitting element. The first electrode 101 serves as an anode and the second electrode 103 serves as a cathode in Embodiment Mode 1.

As an anode material for forming the first electrode 101, a metal, an alloy, or an electrically conductive compound each of which has high work function (work function of 4.0 eV or more), a mixture thereof, or the like is preferable. As a specific example of such anode materials, the following can be used: ITO (indium tin oxide), ITO containing silicon oxide (ITSO, indium tin silicon oxide), IZO (indium zinc oxide) formed using a target in which zinc oxide (ZnO) of 2 to 20 wt % is mixed into indium oxide, gold (Au), platinum (Pt), nickel (Ni), tungsten (W), chromium (Cr), molybdenum (Mo), iron (Fe), cobalt (Co), copper (Cu), palladium (Pd), a metal nitride such as TiN, or the like.

Meanwhile, as a cathode material used for forming the second electrode 103, it is preferable to use a metal, an alloy, or an electrically conductive compound each of which has low work function (work function of 3.8 eV or less), a mixture thereof, or the like. As a specific example of such cathode materials, the following can be used; an element belonging to Group 1 or 2 in the periodic table; an alkali metal such as Li (lithium) or Cs (cesium) or an alkaline earth metal such as Mg (magnesium), Ca (calcium) or Sr (strontium). In addition, an alloy containing the above element such as Mg:Ag or Al:Li can be used. However, by providing a layer having an excellent electron injecting property such that the second electrode is stacked thereover the layer between the second electrode 103 and the light-emitting layer 113, various conductive materials including the above described materials for the first electrode 101 such as Al, Ag, ITO and ITSO can be used for the second electrode 103, regardless of the work function.

The first electrode 101 and the second electrode 103 can be formed from the above described materials for an anode or a cathode by an evaporation method, a sputtering method or the like. It is to be noted that the film thickness is preferably 10 to 50 nm.

In addition, in the light-emitting element of the present invention, light generated by recombination of carriers in the light-emitting layer is emitted outside through one or both of the first electrode 101 and the second electrode 103. For example, when light is emitted through the first electrode 101, the first electrode 101 is formed from a light-transmitting material. When light is emitted through the second electrode 103, the second electrode 103 is formed from a light-transmitting material.

The layer including a light-emitting substance 102 is formed by sequentially stacking the hole injecting layer 111, the hole transporting layer 112, the light-emitting layer 113, the electron transporting layer 114, and the electron injecting layer 115 in Embodiment Mode 1.

The hole injecting layer 111 is provided to be in contact with the first electrode 101. The hole injecting layer 111 can receive holes from the first electrode 101, and is formed from a material capable of injecting holes to the hole transporting layer 112. For example, a phthalocyanine based compound such as phthalocyanine ($H_2$-Pc) or copper phthalocyanine (Cu-Pc), or an aromatic amine based compound (in other words, a compound having a benzene ring-nitrogen bond) such as 4,4'-bis[N-(4-(N,N-di-m-trylamino)phenyl)-N-phenylamino]biphenyl (DNTPD) or 4,4',4''-tris[N-(3-methylphenyl)-N-phenylamino]triphenylamine (MTDATA) can be used. Further, a conductive inorganic compound (including semiconductor) such as molybdenum oxide ($MoO_x$) or vanadium oxide ($VO_x$) can be used. Furthermore, a mixture of such conductive inorganic compound and an aromatic amine based compound described above or below can be used. This mixture can be formed by a method such as a co-evaporation method. Note that the co-evaporation method is an evaporation method in which evaporation materials are evaporated from a plurality of evaporation sources at the same time in one treatment chamber.

The hole transporting layer 112 can be formed from a material capable of transporting holes. Specifically, an aromatic amine based compound is preferably used. For example, 4,4'-bis[N-(3-methylphenyl)-N-phenyl-amino]-biphenyl (TPD), 4,4'-bis[N-(1-naphthyl)-N-phenyl-amino]-biphenyl (NPB), and further, star burst aromatic amine compounds such as 4,4',4''-tris(N-carbazolyl)triphenylamine (TCTA), 4,4',4''-tris(N,N-diphenyl-amino)-triphenylamine (TDATA), and the above mentioned MTDATA can be used. Further, a mixture of a conductive inorganic compound (including semiconductor) such as molybdenum oxide ($MoO_x$) or vanadium oxide ($VO_x$) and an aromatic amine based compound described above can also be used.

The light-emitting layer 113 is formed by co-evaporation of a host material and at least one of organometallic complexes having structures shown in general formulas (1) to (4) and organometallic complexes shown in general formulas (5) to (8).

Concrete examples of substituents $R^1$ to $R^{16}$ shown by the general formulas (1) to (8) are as follows: an acetyl group, a propionyl group, an isobutyryl group, a methacryloyl group and the like are given as an acyl group; a methyl group, an ethyl group, an n-propyl group, an iso-propyl group, a tert-butyl group, an octyl group and the like are given as an alkyl group; a methoxy group, an ethoxy group, a propoxy group and the like are given as an alkoxyl group; a phenyl group, a 4-metylphenyl group, a 4-etylphenyl group and the like are given as an aryl group; a pyridyl group, a bipyridyl group, a methylpyridyl group and the like are given as a heterocyclic group; a fluoro group, a trifluoromethyl group, a cyano group and the like are given as a electron-withdrawing group.

Further, as concrete examples of an element belonging to Group 9 or 10 in the periodic table, iridium, platinum, etc., are given. Note that the present invention is not limited to the exemplified elements.

The ligand L represents a monoanionic ligand having a β-diketone structure, a monoanionic bidentate ligand having a carboxyl group, or a monoanionic bidentate ligand having a phenolic hydroxyl group. Anions shown in the formulas (9) to (15) are given as specific examples. Since the ligands have a high coordinative ability and can be obtained at a low price, they are effective.

The organometallic complexes having structures shown in the general formulas (1) to (4) and the organometallic complexes shown in the general formulas (5) to (8) easily receive holes due to the organic-metal bond, and also easily receive electrons due to the quinoxaline skeleton. Therefore, the organometallic complexes have an advantage that carriers can be trapped effectively.

Further, the electron withdrawing group is preferably any one of a halogen group, a haloalkyl group, and a cyano group. Thus, chromaticity and quantum efficiency of the organometallic complex are enhanced. In addition, a fluoro group is preferable among a halogen group, and a trifluorometyl group is preferable among an haloalkyl group, in particular. Thus, a trapping property of electrons is more enhanced.

As a host material, a substance having a larger energy gap than at least one organometallic complex selected from the organometallic complexes having structures shown in the general formulas (1) to (4) and the organometallic complexes shown in the general formulas (5) to (8), is preferred. Note that the energy gap means an energy difference between Lowest Unoccupied Molecular Orbital (LUMO) level and Highest Occupied Molecular Orbital (HOMO) level.

As concrete examples of a substance which can be used as the host material, 4,4'-bis(N-carbazolyl)biphenyl (CBP), an aromatic amine compound such as 4,4',4''-tris(N-carbazolyl)-triphenylamine (TCTA) or the above described NBP or TPD, a metal complex such as tris(8-quinolinolato)aluminum ($Alq_3$), or tris(8-quinolinolato)gallium ($Gaq_3$), or tris(4-metyl-8-quinolinolato)aluminum ($Almq_3$), or the like can be given. $Alq_3$, $Gaq_3$, and $Almq_3$ described above are also given as concrete examples of an electron transporting metal complex.

The electron transporting layer 114 is preferably formed using a material which can transport electrons injected to the layer including a light-emitting substance from an electrode serving as a cathode, into the light-emitting layer. As concrete examples of the material, a metal complex having a quinoline skeleton or a benzoquinoline skeleton, such as $Alq_3$, $Gaq_3$, $Almq_3$, or bis(10-hydroxybenzo[h]-quinolinato)beryllium ($BeBq_2$), or bis(2-metyl-8-quinolinolato)-4-phenylphenolato-aluminum (BAlq) are given. Moreover, a metallic complex including an oxazole based or thiazole based ligand, such as bis[2-(2-hydroxyphenyl)-benzoxazolato]zinc (Zn$(BOX)_2$), or bis[2-(2-hydroxyphenyl)-benzothiazolato]zinc (Zn$(BTZ)_2$), or the like can be used as a material for forming the electron transporting layer 114. Further, 2-(4-biphenylyl)-5-(4-tert-buthylphenyl)-1,3,4-oxadiazole (PBD), 1,3-bis[5-(p-tert-buthylphenyl)-1,3,4-oxadiazole-2-yl]benzene (OXD-7), 3-(4-tert-buthylphenyl)-4-phenyl-5-(4-biphenylyl)-1,2,4-triazole (TAZ), 3-(4-tert-buthylphenyl)-4-(4-ethylpheyl)-5-(4-biphenylyl)-1,2,4-triazole (p-EtTAZ), bathophenanthroline (BPhen), bathocuproin (BCP), and further an inorganic material such as titanium oxide may be used.

The electron injecting layer 115 is formed using a layer in which any one of the above described electron transporting materials and a substance showing an electron donating property to the electron transporting material are mixed. As the substance showing an electron donating property, for example, a metal having a low work function can be given. Specifically, an alkali metal or an alkaline earth metal is preferable, in particular, Li, Mg, and Cs are preferable. Note that the electron injecting layer 115 can be formed by a method such as a co-evaporation method.

In a light-emitting element of the present invention, by mixing, into the electron injecting layer, an organic compound and a substance showing an electron donating property to the organic compound, the amount of electrons injected to the light-emitting layer is increased, and thus, holes can be prevented from reaching the electron transporting layer. Therefore, the organometallic complex which is used as a light-emitting substance can emit light more efficiently.

In addition, the layer structure of a light-emitting element of the present invention is not limited to the above and layers may be formed sequentially in the order from the electrode serving as a cathode.

Embodiment Mode 2

Figure 2:
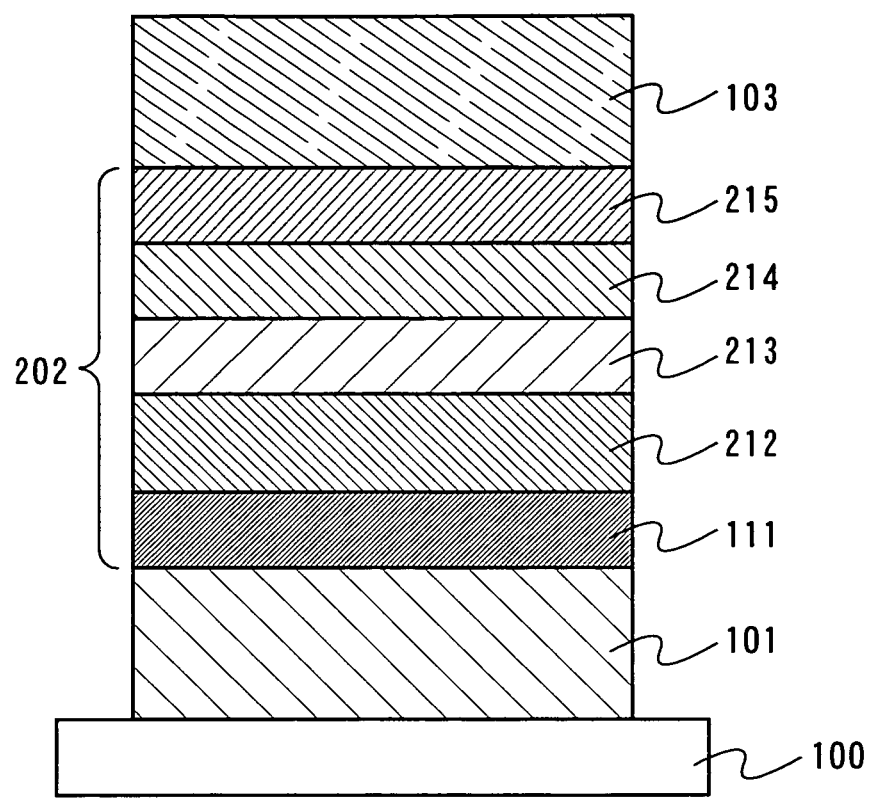
FIG. 2 shows an element structure of a light-emitting element according to an aspect of the present invention.

One mode of a light-emitting element of the present invention will be described with reference to FIG. 2. As shown in FIG. 2, a first electrode 101 is formed over a substrate 100, a layer including a light-emitting substance 202 is formed over the first electrode 101, and a second electrode 103 is formed thereover. Note that a different point from Embodiment Mode 1 is that a material having a higher triplet excitation energy than an organometallic complex serving as a light-emitting substance is used, for a hole transporting layer, a host included in a light-emitting layer, and an electron transporting layer. As for the similar elements to those of Embodiment Mode 1 are shown by the common reference numerals and detailed description is omitted. In addition, in this embodiment mode, the first electrode 101 serves as an anode and the second electrode 103 serves as a cathode.

The layer including a light-emitting substance 202 is formed by stacking a plurality of layers. In this embodiment mode, a hole injecting layer 111, a hole transporting layer 212, a light-emitting layer 213, an electron transporting layer 214, and an electron injecting layer 215 are sequentially stacked to form the layer including a light-emitting substance 202. These layers can be formed by an evaporation method or a coating method.

As for materials and manufacturing method for the first electrode 101, the second electrode 103 and the hole injecting layer 111, the description for the first electrode, the second electrode and the hole injecting layer in Embodiment Mode 1 can be referred to. In addition, as for the light-emitting substance, as in Embodiment Mode 1, any one of the organometallic complexes having structures shown in the general formulas (1) to (4) and the organometallic complexes shown in the general formulas (5) to (8) is used.

A material capable of transporting holes and having a higher triplet excitation energy than an organometallic complex serving as a light-emitting substance, is used for the hole transporting layer 212. There is no particular limitation, as long as a material to be used satisfies the above condition. As in Embodiment Mode 1, a star burst aromatic amine based compound or the like other than aromatic amine compounds can be used. Furthermore, a mixture of a conductive inorganic compound (including semiconductor) such as molybdenum oxide ($MoO_x$) or vanadium oxide ($VO_x$) and an aromatic amine based compound described above can also be used. For example, in a case that Alq or CBP is used as a host material of the light-emitting layer, NPB or TCTA having a higher triplet excitation energy is preferable as the material of the hole transporting layer 212.

The light-emitting layer 213 is formed by co-evaporation of a host material and at least one of the organometallic complexes having structures shown in the general formulas (1) to (4) and the organometallic complexes shown in the general formulas (5) to (8). As the host material, preferably used is a material having a higher triplet excitation energy than the organometallic complexes having structures shown in the general formulas (1) to (4) and the organometallic complexes shown in the general formulas (5) to (8). There is no particular limitation, as long as a material to be used satisfies the above condition. Similarly to Embodiment Mode 1, an aromatic amine based compound such as NPB or TPD, or a metal complex such as $Alq_3$, $Gaq_3$ or $Almq_3$ or the like can be used as the host material.

The electron transporting layer 214 is formed using a material which is capable of transporting electrons injected to the layer including a light-emitting substance from the electrode serving as a cathode, into the light-emitting layer, and which has a higher triplet excitation energy than the organometallic complex serving as a light-emitting substance. There is no particular limitation, as long as a material to be used satisfies the above condition. Similarly to Embodiment Mode 1, a metal complex having a quinoline skeleton or a benzoquinoline skeleton, such as $Alq_3$, $Gaq_3$, $Almq_3$ or $BeBq_2$, or BAlq can be given. In addition to these, metal complexes having an oxazole ligand or a thiazole ligand, such as $Zn(BOX)_2$ or $Zn(BTZ)_2$ can also be used as a material for forming the electron transporting layer 214. Further, in addition to PBD, OXD-7, TAZ, p-EtTAZ, BPhen, and BCP, an inorganic material such as titanium oxide may also be used.

The electron injecting layer 215 is preferably formed from a layer in which an organic compound and a substance showing an electron donating property to the organic compound are mixed, similarly to the electron injecting layer 115 described in Embodiment Mode 1. In addition, the materials which can be used for the electron transporting layer 114, mentioned in Embodiment Mode 1 can also be used. Besides, an ultra thin film of an alkali metal halide such as LiF and CsF, an alkali earth halide such as $CaF_2$, and an alkali metal oxide such as $Li_2O$ may be used. Also, alkali metal complexes such as lithium acetylacetonate (Li(acac)) and 8-quinolinolato-lithium (Liq) can also be effectively used.

One feature of the light-emitting element of the present invention is that the materials of the hole transporting layer, a host included in the light-emitting layer and the electron transporting layer have a higher triplet excitation energy than a triplet excitation energy of the organometallic complex which is a light-emitting substance. Thus, current efficiency and external quantum efficiency can be increased. Specifically, it is possible that a current efficiency of 2.0 cd/A or more and an external quantum efficiency of 5% or more are obtained. In addition, color purity is also excellent. It is also possible that the CIE chromaticity coordinate of X≥0.7 and Y≤0.3 is obtained, and surpasses NTSC (National Television System Committee) standard.

This embodiment mode has shown the case where a material having a higher triplet excitation energy than an organometallic complex which is a light-emitting substance is used for the hole transporting layer 212, a host included in the light-emitting layer 213, and the electron transporting layer 214. However, in a case that the material is used for one layer or two layers of the three layers described above, the same effect can be obtained.

Example 1

Example 1 will describe a light-emitting element in which an organometallic complex represented by the above-mentioned general formula (7), bis{2,3-bis(4-fluorophenyl)quinoxalinato}acetylacetonato iridium(III) ($Ir(Fdpq)_2(acac)$) is used as a light-emitting substance and a mixture layer of Alq and Li is used as an electron injecting layer, and a manufacturing method of the light-emitting element with reference to FIG. 1. Note that $Ir(Fdpq)_2(acac)$ is represented by a formula (16).

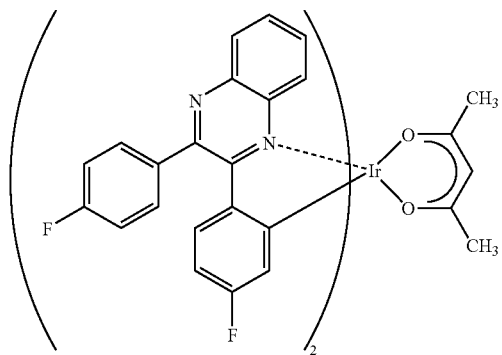

(16)

An ITSO film was formed by a sputtering method over a substrate 100 to form a first electrode 101.

Next, the substrate 100 provided with the first electrode 101 was fixed on a substrate holder provided in a vacuum evaporation apparatus in such a way that a surface provided with the first electrode 101 faced downward.

Next, a DNTPD film was formed over the first electrode 101 to have a thickness of 50 nm by an evaporation method using resistance heating to form a hole injecting layer 111.

Then, an NPB film was formed over the hole injecting layer 111, to have a thickness of 10 nm by an evaporation method using resistance heating to form a hole transporting layer 112.

Next, over the hole transporting layer 112, a film of $Ir(Fdpq)_2(acac)$ and $Alq_3$ was formed to have a thickness of 30 nm by a co-evaporation method to form a light-emitting layer 113. Here, the mass ratio of $Alq_3$ to $Ir(Fdpq)_2(acac)$ was set to 1:0.08(=$Alq_3$:$Ir(Fdpq)_2(acac)$). Thus, $Ir(Fdpq)_2(acac)$ was dispersed in the film made of $Alq_3$.

Over the light-emitting layer 113, an $Alq_3$ film was formed to have a thickness of 10 nm by an evaporation method using resistance heating to form an electron transporting layer 114.

Over the electron transporting layer 114, an electron injecting layer 115 was formed to have a thickness of 50 nm by co-evaporation of $Alq_3$ and Li. Here, the mass ratio of $Alq_3$ to Li was set to 1:0.01(=$Alq_3$:Li).

Over the electron injecting layer 115, a second electrode 103 was formed from aluminum by an evaporation method using resistance heating. Then, the light-emitting element obtained as above was sealed in a nitrogen atmosphere.

Comparative Example 1

As a comparative example with the light-emitting element in Example 1, a light-emitting element having an electron injecting layer into which Li was not introduced was manufactured. In this comparative example, the electron injecting layer 115 was formed from $Alq_3$ only, and a layer having an excellent electron injecting function was formed to have a thickness of 1 nm between the electron injecting layer 115 and the second electrode 103. Note that elements other than the above were formed of the same material and by the same method as in Example 1.

Specifically, the hole injecting layer 111 was formed from DNTPD over the first electrode 101 to have a thickness of 50 nm, the hole transporting layer 112 was formed from NPB to have a thickness of 10 nm, and the light-emitting layer 113 was formed by co-evaporation of $Alq_3$ and $Ir(Fdpq)_2(acac)$ to have a thickness of 30 nm. Over the light-emitting layer 113, the electron transporting layer 114 and the electron injecting layer 115 were formed from $Alq_3$ to have a total thickness of the both layers of 60 nm by an evaporation method using resistance heating. Further, over the electron injecting layer 115, $CaF_2$ having an excellent electron injecting function was formed to have a thickness of 1 nm by an evaporation method using resistance heating. Note that the difference in the film thickness between Example 1 and this comparative example was 1 nm.

Figure 3:
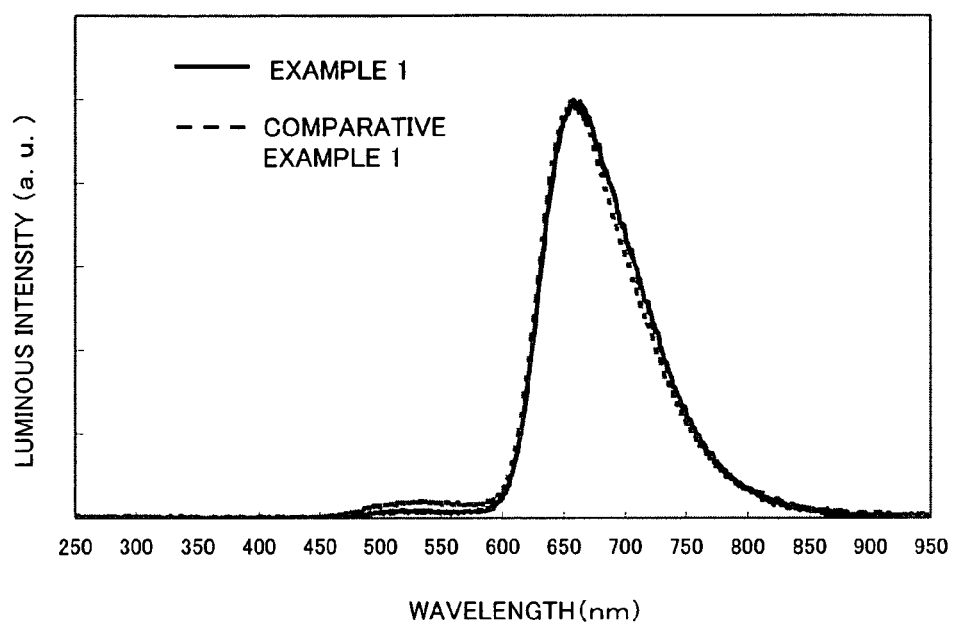
FIG. 3 shows an emission spectrum of a light-emitting element manufactured in Example 1.

Emission spectra of the light-emitting elements in Example 1 and Comparative Example 1 are shown in FIG. 3. In the light-emitting element as Comparative Example, a broad peak at around 525 nm was observed. On the contrary, it was found that the peak can be suppressed in the light-emitting element of Example 1. Note that the peak at around 525 nm shows green emission which is considered to result from $Alq_3$.

Since the organometallic complex used in the present invention has a strong electron trapping property, a light-emitting region exists in the periphery of an interface between the light-emitting layer and the electron transporting layer. Therefore, when the amount of electrons injected into the element is small, holes reaches the electron transporting layer, and $Alq_3$ of the electron transporting layer emitted light, like Comparative Example 1. It can be considered that in Example 1, by introducing Li into the electron injecting layer, the amount of electrons injected into the light-emitting layer was increased, thereby suppressing green emission of $Alq_3$ resulting from hole intrusion to the electron transporting layer; therefore, $Ir(Fdpq)_2(acac)$ used as a light-emitting substance could emit light more efficiently.

Based upon the foregoing, it can be said that the light-emitting of the present invention is a favorable light-emitting element exhibiting high luminous efficiency.

Example 2

Example 2 will describe a light-emitting element in which $Ir(Fdpq)_2(acac)$ is used as a light-emitting substance, and TAZ which has a higher triplet excitation energy than $Ir(Fdpq)_2(acac)$ is used for an electron transporting layer with reference to FIG. 2.

An ITSO film was formed by a sputtering method over a substrate 100 to form a first electrode 101.

Next, the substrate 100 provided with the first electrode 101 is fixed on a substrate holder provided in a vacuum evaporation apparatus in such a way that a surface provided with the first electrode 101 faced downward.

Next, over the first electrode 101, a DNTPD film was formed to have a thickness of 40 nm by an evaporation method using resistance heating to form a hole injecting layer 111.

Then, over the hole injecting layer 111, an NPB film was formed to have a thickness of 20 nm by an evaporation method using resistance heating to form a hole transporting layer 212.

Next, over the hole transporting layer 212, a film of $Ir(Fdpq)_2(acac)$ and $Alq_3$ was formed to have a thickness of 30 nm by a co-evaporation method to form a light-emitting layer 213. Here, the mass ratio of $Alq_3$ to $Ir(Fdpq)_2(acac)$ was set to 1:0.08(=$Alq_3$:$Ir(Fdpq)_2(acac)$). Thus, $Ir(Fdpq)_2(acac)$ was dispersed in the film made of $Alq_3$.

Over the light-emitting layer 213, a TAZ film was formed to have a thickness of 20 nm by an evaporation method using resistance heating to form an electron transporting layer 214.

Over the electron transporting layer 214, an electron injecting layer 215 was formed to have a thickness of 40 nm by co-evaporation of TAZ and Li. Here, the mass ratio of TAZ to Li was set to 1:0.01 (=TAZ:Li).

Over the electron injecting layer 215, a second electrode 103 was formed from aluminum by an evaporation method using resistance heating. Then, the light-emitting element obtained as above was sealed in a nitrogen atmosphere.

Comparative Example 2

The electron transporting layer 214 and the electron injecting layer 215 were formed from TAZ and TAZ:Li, respectively, in Example 1. Meanwhile, in Comparative Example 2, $Alq_3$ having a lower triplet excitation energy than TAZ was used instead of TAZ, and the electron transporting layer 214 and the electron injecting layer 215 were formed from $Alq_3$ and $Alq_3$:Li, respectively. The others structures were made by using the same substances and methods as in Example 2. In addition, the element structures of Example 2 and Comparative Example 2 are shown in Table 1.

TABLE 1

| | HOLE INJECTING LAYER [40 nm] | HOLE TRANSPORTING LAYER [20 nm] | HOST MATERIAL OF LIGHT EMITTING LAYER [30 nm] | ELECTRON TRANSPORTING LAYER [20 nm] | ELECTRON INJECTING LAYER [40 nm] |
|---|---|---|---|---|---|
| EXAMPLE 2 | DNTPD | NPB | $Alq_3$ | TAZ | TAZ:Li |
| COMPARATIVE EXAMPLE 2 | DNTPD | NPB | $Alq_3$ | $Alq_3$ | $Alq_3$:Li |

Figure 4A:
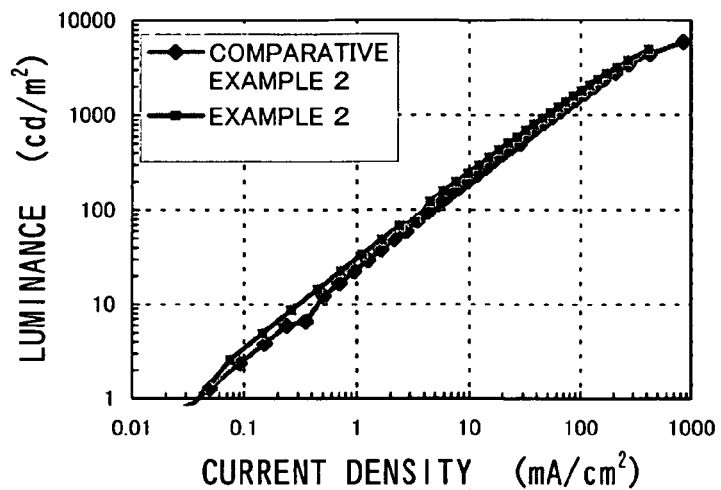
FIGS. 4A to 4C show performance characteristics of a light-emitting element manufactured in Example 2.
Figure 4B:
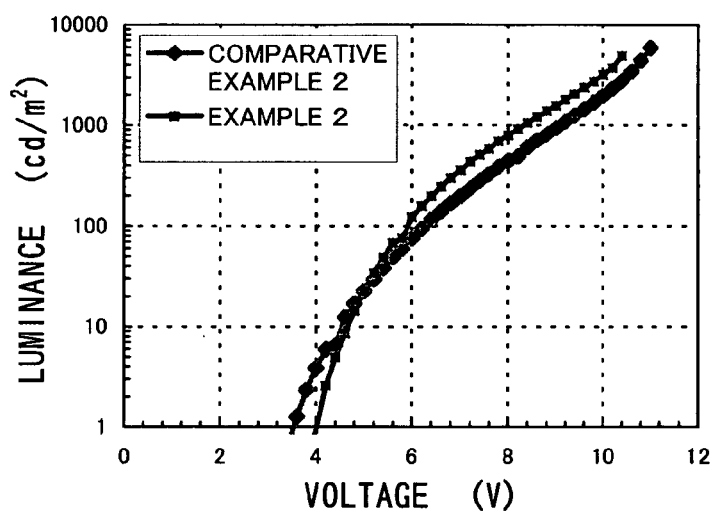
Figure 4C:
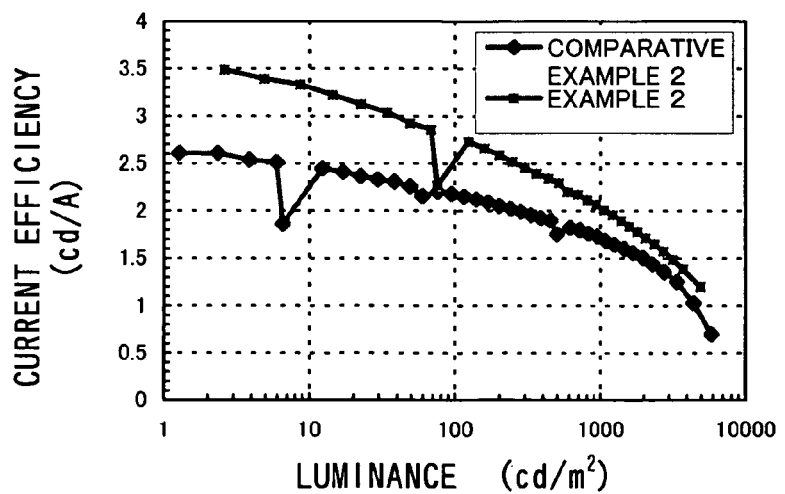

Performance characteristics of light-emitting elements of Example 2 and Comparative Example 2 were measured by applying a voltage to each of the light-emitting elements such that a potential of the first electrode 101 became higher than that of the second electrode 103. In addition, the measurements were conducted at a room temperature kept at 25° C. The results are shown in FIGS. 4A to 4C. FIGS. 4A, 4B and 4C show measurement results for current density-luminance characteristics, voltage-luminance characteristics, and luminance-current efficiency characteristics, respectively. In FIG. 4A, the horizontal axis represents current density (mA/cm$^2$) and the vertical axis represents luminance (cd/m$^2$). In FIG. 4B, the horizontal axis represents voltage (V) and the vertical axis represents luminance (cd/cm$^2$). In FIG. 4C, the horizontal axis represents luminance (cd/cm$^2$) and the vertical axis represents current efficiency (cd/A).

According to the results, it was found that the light-emitting element of Comparative Example 2 emitted light at a luminance of 500 cd/m$^2$ when a voltage of 8.0 V was applied thereto, while the light-emitting elements of Example 2 emitted light at 7.4V. Further, it was found that the light-emitting element of Example 2 has superior current efficiency and external quantum efficiency to the light-emitting element of Comparative Example 2. The current efficiency and the external quantum efficiency at 500 cd/m$^2$ of the light-emitting element of Example 2 were 2.3 cd/A and 6.7%, respectively. Note that the external quantum efficiency is a rate of photons emitted outside the element with respect to the number of electrons injected into the light-emitting element. Accordingly, when the number of photons per unit area is Np, and the number of electrons per unit area is Ne, the following expression (17) is obtained.

$$\phi_{ext} = N_p/N_e \tag{17}$$

Np can be represented by the following expression (18), when L is luminance (cd/m$^2$), λ is a wavelength (nm), I(λ) is a normalized emission spectrum (normalized emission intensity in each wavelength), K(λ) is a normalized relative luminosity curve, c is light speed, and h is Planck constant.

$$N_p = \frac{\pi \cdot L}{\int I(\lambda)K(\lambda)d\lambda} \cdot \int \frac{I(\lambda)\lambda}{683 \cdot c \cdot h} d\lambda \tag{18}$$

Ne can be represented by the following expression (19), when J is current density (A/m$^2$) and e is an amount of elementary electric charge (C).

$$N_e = J/e \tag{19}$$

The following expression (20) can be obtained from the expressions (17) to (19).

$$\phi_{ext} = \frac{\pi \cdot e}{683 \cdot c \cdot h} \cdot \frac{L}{J} \cdot \frac{\int I(\lambda)\lambda d\lambda}{\int I(\lambda)K(\lambda)d\lambda} \tag{20}$$

Figure 5:
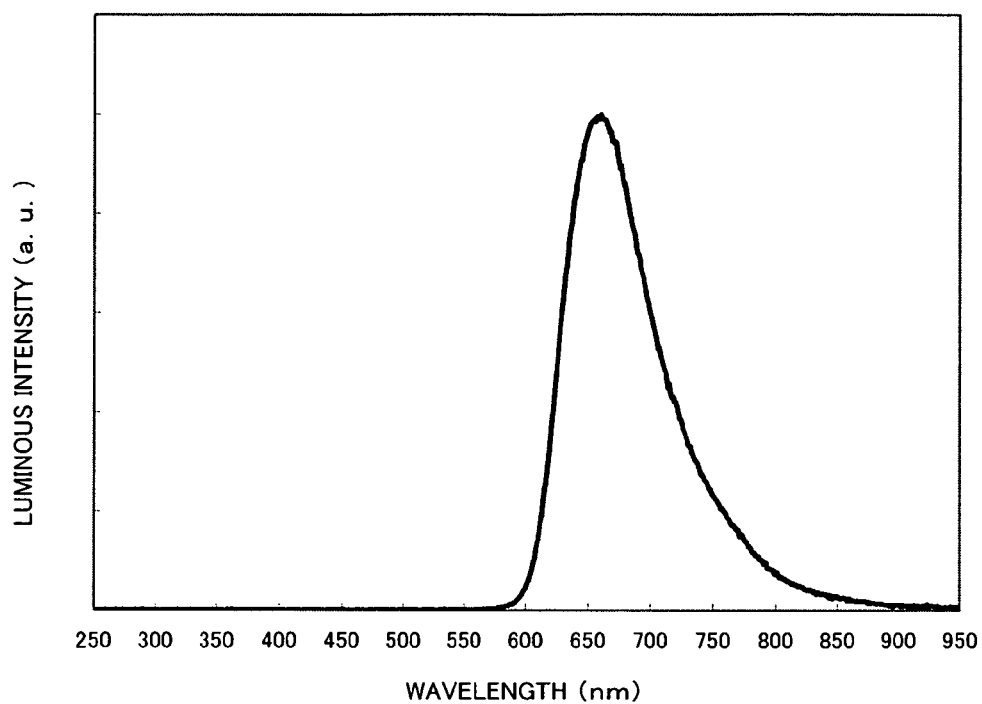
FIG. 5 shows an emission spectrum of a light-emitting element manufactured in Example 2.

Therefore, the external quantum efficiency was calculated as 6.7% from the current efficiency obtained in the above measurement and the emission spectrum shown in FIG. 5.

Based upon the foregoing, it was found that by selecting, as the material of the electron transporting layer, a material having a higher triplet excitation energy than an organometallic complex which is a light-emitting substance, current efficiency and external quantum efficiency can be more increased.

Figure 14:
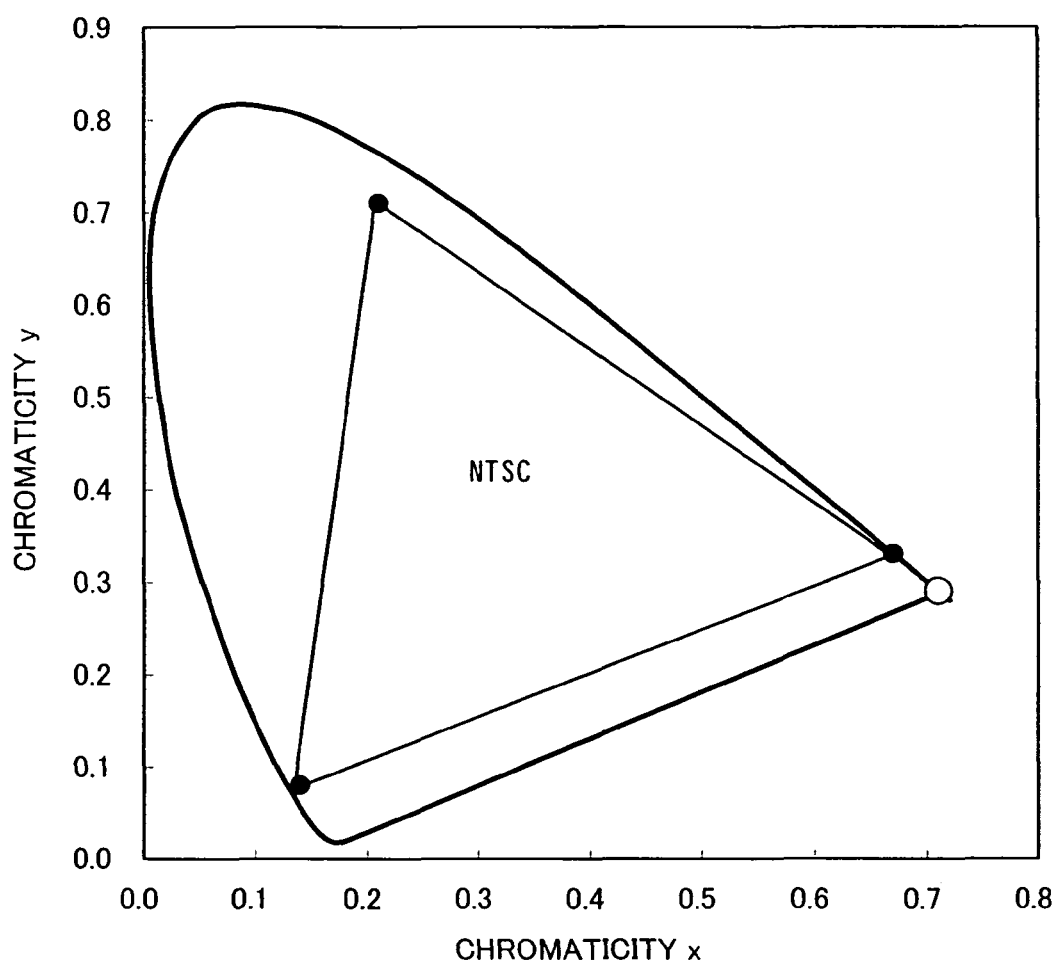
FIG. 14 is a graph showing a comparison between a light-emitting element according to an aspect of the present invention, and the NTSC standard.

In addition, it can be seen that the light-emitting element of Example 2 is a red-light emitting element having excellent color purity, since its CIE chromaticity coordinate is (X, Y)=(0.71, 0.29). Note that as shown in FIG. 14, the CIE chromaticity coordinate is larger than NTSC standard, and a display device incorporating the light-emitting element of the present invention can display colorful images with richness of colors.

Example 3

In Example 3, a light-emitting element was formed by the same substances and methods as in Example 2, except that the host material of the light-emitting layer was changed as described below. In Example 3, as the host material of the light-emitting layer 213, CBP was used. CBP has a higher triplet excitation energy than Ir(Fdpq)$_2$(acac) which is a light-emitting substance, and Alq$^3$.

The light-emitting layer 213 was formed to have a thickness of 30 nm by co-evaporation of Ir(Fdpq)$_2$(acac) and CBP. Here, the mass ratio of CBP to Ir(Fdpq)$_2$(acac) was set to 1:0.08(=CBP:Ir(Fdpq)$_2$(acac)). Thus, Ir(Fdpq)$_2$(acac) was dispersed in a film made of CBP.

Figure 6A:
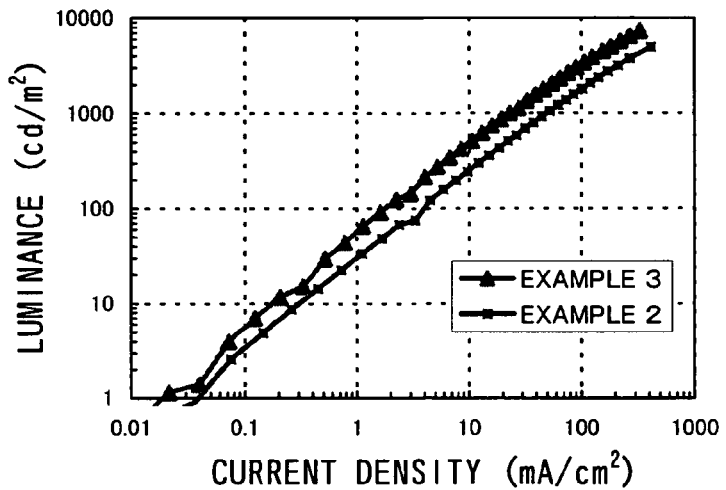
FIGS. 6A to 6C show performance characteristics of a light-emitting element manufactured in Example 3.
Figure 6B:
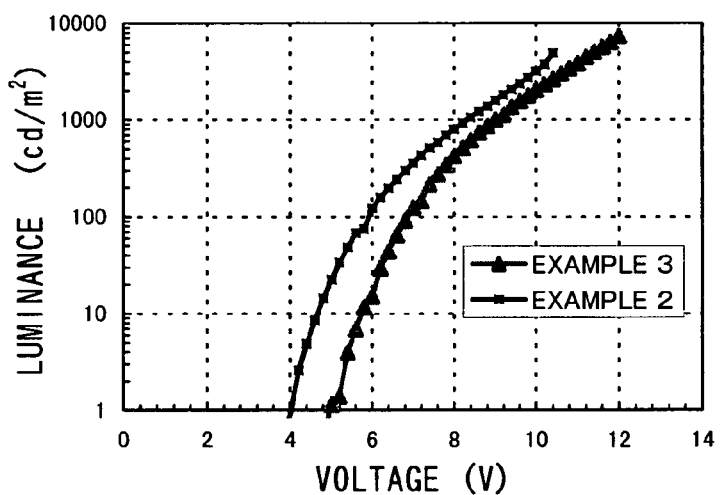
Figure 6C:
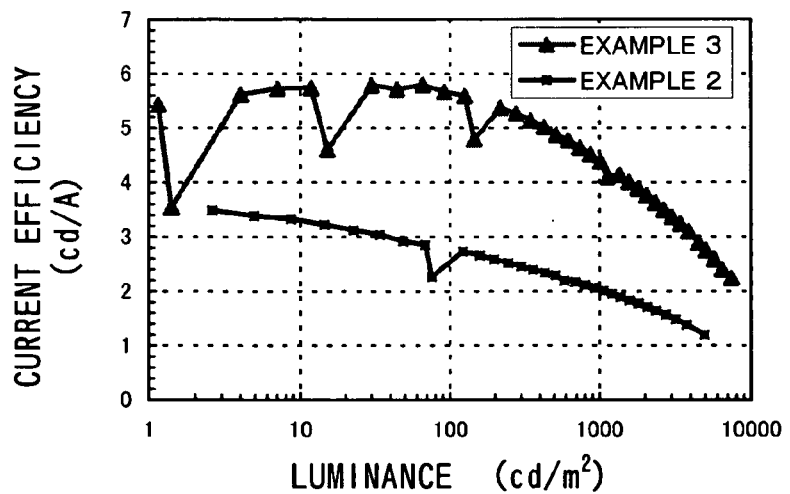
Figure 7:
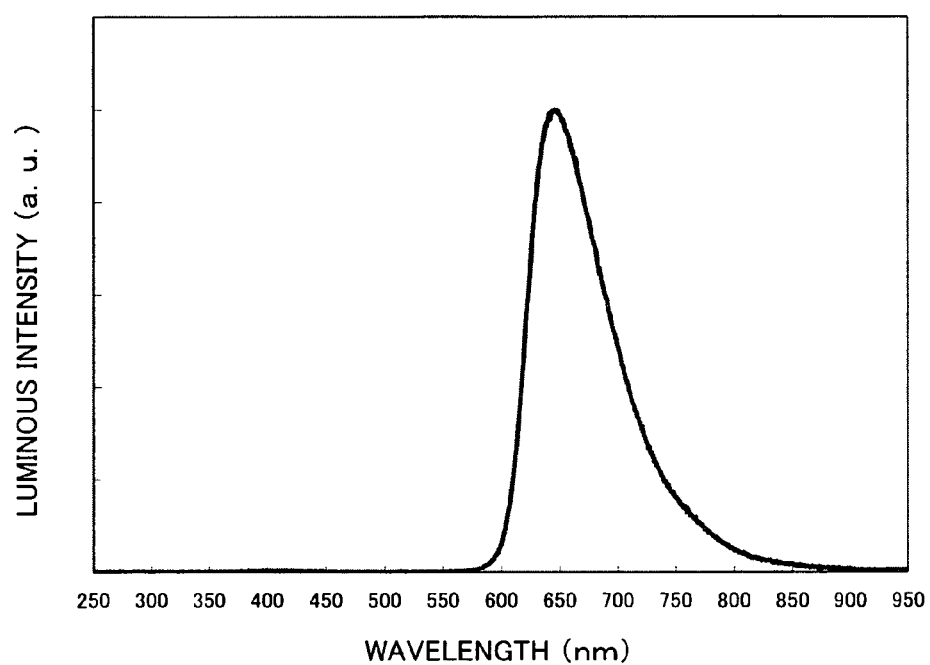
FIG. 7 shows an emission spectrum of a light-emitting element manufactured in Example 3.

The light-emitting element formed as above was sealed in a nitrogen atmosphere. After that, performance characteristics of the light-emitting element were measured by applying a voltage such that a potential of the first electrode 101 became higher than that of the second electrode 103. In addition, the measurement was conducted at a room temperature kept at 25° C. The results are shown in FIGS. 6A to 6C. In this example, the measurement result of Example 2 is also shown in FIGS. 6A to 6C so as to show an effect caused by using different host materials. FIGS. 6A, 6B and 6C show measurement results for current density-luminance characteristics, voltage-luminance characteristics, and luminance-current efficiency characteristics, respectively. FIG. 7 shows an emission spectrum of a light-emitting element of Example 3. In addition, the element structures of Example 3 and Example 2 are shown in Table 2.

TABLE 2

|  | HOLE INJECTING LAYER [40 nm] | HOLE TRANSPORTING LAYER [20 nm] | HOST MATERIAL OF LIGHT-EMITTING LAYER [30 nm] | ELECTRON TRANSPORTING LAYER [20 nm] | ELECTRON INJECTING LAYER [40 nm] |
|---|---|---|---|---|---|
| EXAMPLE 3 | DNTPD | NPB | CBP | TAZ | TAZ:Li |
| EXAMPLE 2 | DNTPD | NPB | Alq$_3$ | TAZ | TAZ:Li |

The light-emitting element in Example 3 needed 8.2 V when emitting light at a luminance of 500 cd/m², and the voltage was slightly higher than the voltage for the light-emitting element of Example 2. However, the light-emitting element of Example 3 is even more superior in current efficiency and external quantum efficiency than the light-emitting element of Example 2. The current efficiency and the external quantum efficiency of Example 3 at 500 cd/m² were 4.9 cd/A and 10.9%, respectively.

Based upon the foregoing, it can be seen that by selecting, as the host material of the light-emitting layer, a material which has a higher triplet excitation energy than an organometallic complex which is a light-emitting substance, current efficiency and external quantum efficiency can be more increased.

In addition, it can be seen that the light-emitting element of Example 3 is a red-light emitting element having excellent color purity, since it has CIE chromaticity coordinate is (X, Y)=(0.71, 0.29). Note that as shown in FIG. 14, the CIE chromaticity coordinate is larger than NTSC standard, and a display device incorporating the light-emitting element of the present invention can display colorful images with richness of colors.

Example 4

In Example 4, a light-emitting element was formed by the same substances and methods as in Example 3, except that the electron transporting layer and the electron injecting layer are changed as described below. In Example 4, as the electron transporting layer and the electron injecting layer, BCP was used. BCP has a higher triplet excitation energy than Ir(Fdpq)$_2$(acac) which is a light-emitting substance.

The electron transporting layer 214 was formed from BCP to have a thickness of 20 nm by an evaporation method using resistance heating. In addition, the electron injecting layer 215 was formed to have a thickness of 40 nm by co-evaporation of BCP and Li. Here, the mass ratio of BCP to Li was 1:0.01(=BCP:Li).

Figure 8A:
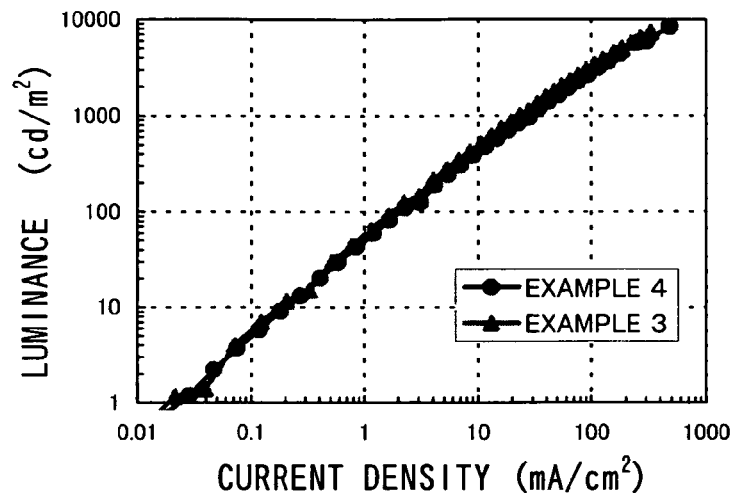
FIGS. 8A to 8C show performance characteristics of a light-emitting element manufactured in Example 4.
Figure 8B:
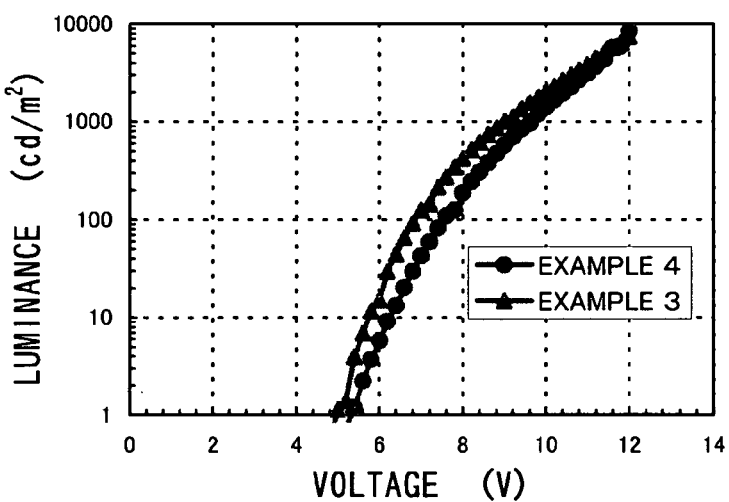
Figure 8C:
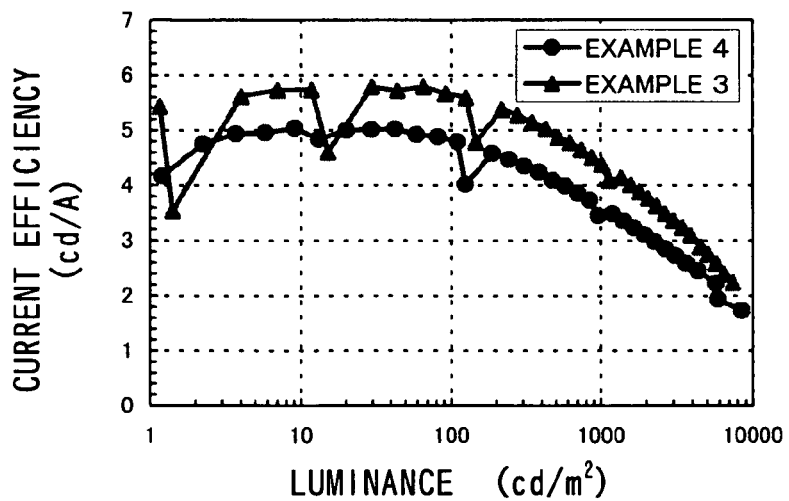
Figure 9:
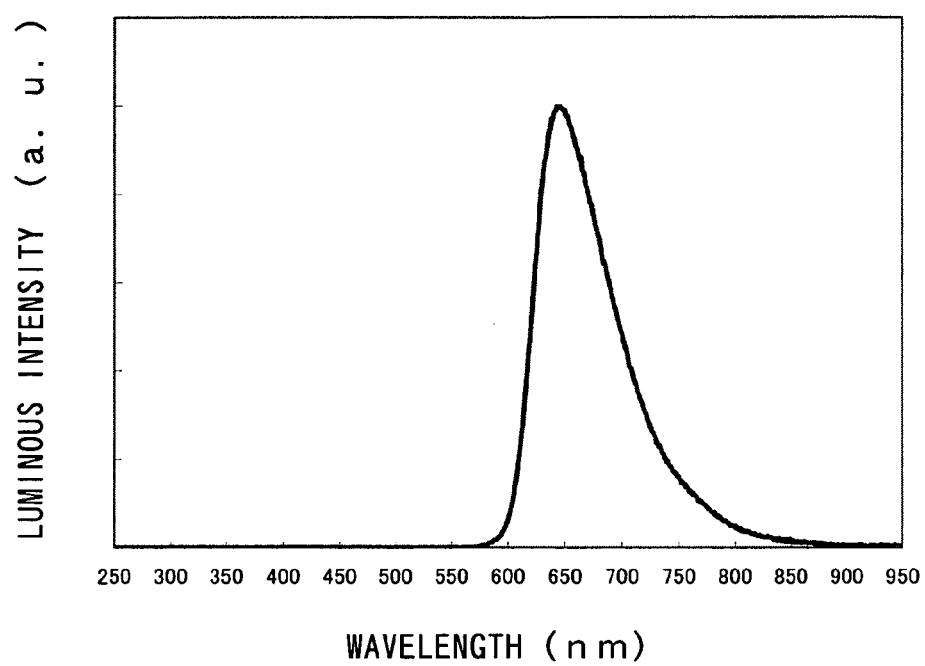
FIG. 9 shows an emission spectrum of a light-emitting element manufactured in Example 4.

The light-emitting element formed as above was sealed in a nitrogen atmosphere. After that, performance characteristics of the light-emitting element were measured by applying a voltage such that a potential of the first electrode 101 became higher than that of the second electrode 103. In addition, the measurement was conducted at a room temperature kept at 25° C. The results are shown in FIGS. 8A to 8C. FIGS. 8A, 8B and 8C show measurement results for current density-luminance characteristics, voltage-luminance characteristics, and luminance-current efficiency characteristics, respectively. In this example, the measurement results for Example 3 are also shown in FIGS. 8A to 8C. FIG. 9 shows an emission spectrum of a light-emitting element of Example 4. In addition, the element structures of Example 4 and Example 3 are shown in Table 3.

The light-emitting element of Example 4 emitted light at a luminance of 500 cd/m² when a voltage of 8.8 V was applied thereto. The light-emitting element of Example 4 is also superior in current efficiency and external quantum efficiency, similar to the light-emitting element of Example 3. The current efficiency and the external quantum efficiency thereof at 500 cd/m² were 4.1 cd/A and 9.0%, respectively.

Based upon the foregoing, it can be seen that by selecting, as the electron transporting layer and the electron injecting layer, a material having a higher triplet excitation energy than an organometallic complex which is a light-emitting substance, current efficiency and external quantum efficiency can be increased.

In addition, it can be seen that the light-emitting element of Example 4 is a red-light emitting element having excellent color purity, since it has a CIE chromaticity coordinate is (X, Y)=(0.71, 0.29).

As compared with the result of Example 3, it can be seen that although the light-emitting element of Example 4 also exhibits high current efficiency and external quantum efficiency, the light-emitting element of Example 3 showed even higher current efficiency and external quantum efficiency than the light-emitting element of Example 4. This can be considered to result from the TAZ having a higher triplet excitation energy than BCP used in Example 4, used for the electron transporting layer of the light-emitting element in Example 3. Therefore, the electron transporting layer is preferably formed from a material having a higher triplet excitation energy than an organometallic which is a light-emitting substance.

Note that as shown in FIG. 14, the CIE chromaticity coordinate surpasses NTSC standard, and a display device incorporating the light-emitting element of the present invention can display colorful images with richness of colors.

Example 5

In Example 5, a light-emitting element was formed by the same substances and methods as Example 3, except that the hole transporting layer was changed as described below. In Example 5, as the hole transporting layer, TCTA was used. TCTA has a higher triplet excitation energy than Ir(Fdpq)$_2$(acac) which is a light-emitting substance.

The hole transporting layer 212 was formed from TCTA to have a thickness of 20 nm by an evaporation method using resistance heating.

Figure 10A:
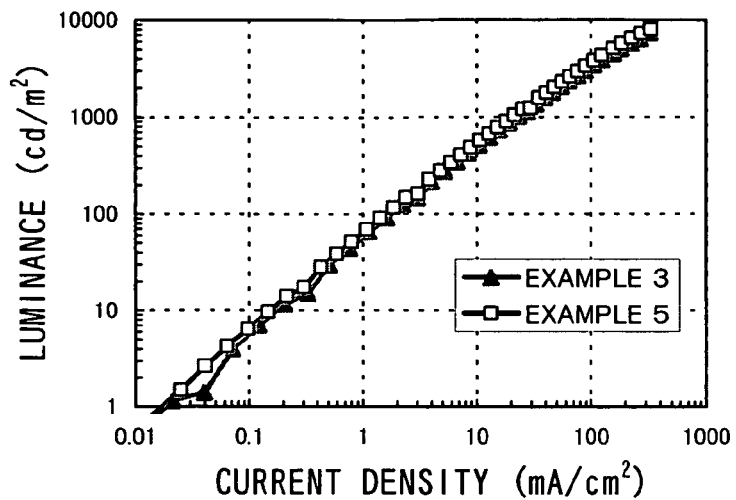
FIGS. 10A to 10C show performance characteristics of a light-emitting element manufactured in Example 5.
Figure 10B:
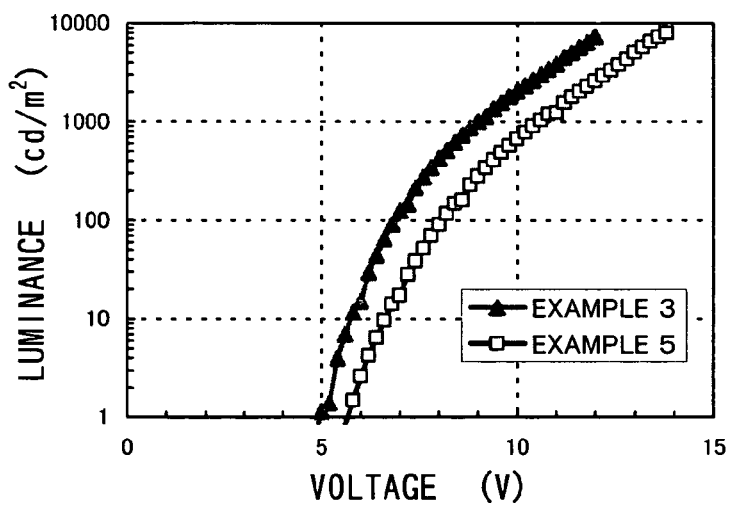
Figure 10C:
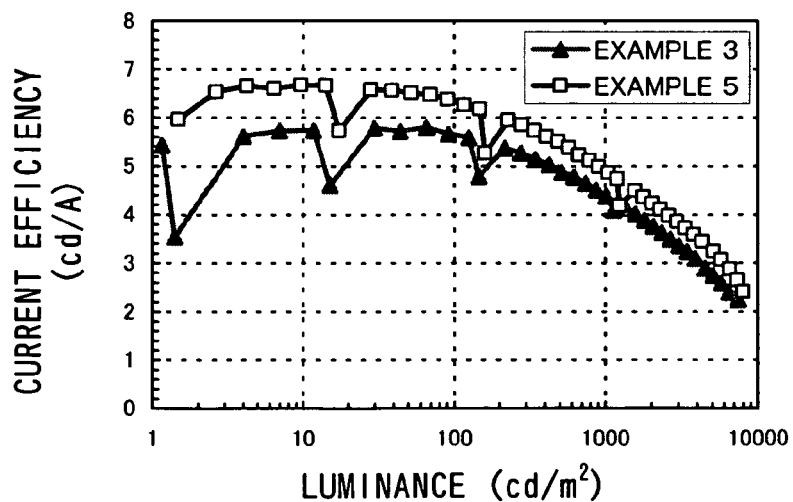

The light-emitting element formed as above was sealed in a nitrogen atmosphere. After that, performance characteristics of the light-emitting element were measured by applying such that a potential of the first electrode 101 became higher than that of the second electrode 103. In addition, the measurement was conducted at a room temperature kept at 25° C. The results are shown in FIGS. 10A to 10C. In this example, the measurement results of Example 3 are also shown in FIGS. 10A to 10C so as to show an effect caused by using different hole transporting materials. FIGS. 10A, 10B and

TABLE 3

| | HOLE INJECTING LAYER [40 nm] | HOLE TRANSPORTING LAYER [20 nm] | HOST MATERIAL IN LIGHT EMITTING LAYER [30 nm] | ELECTRON TRANSPORTING LAYER [20 nm] | ELECTRON INJECTING LAYER [40 nm] |
|---|---|---|---|---|---|
| EXAMPLE 4 | DNTPD | NPB | CBP | BCP | BCP:Li |
| EXAMPLE 3 | DNTPD | NPB | CBP | TAZ | TAZ:Li |

Figure 11:
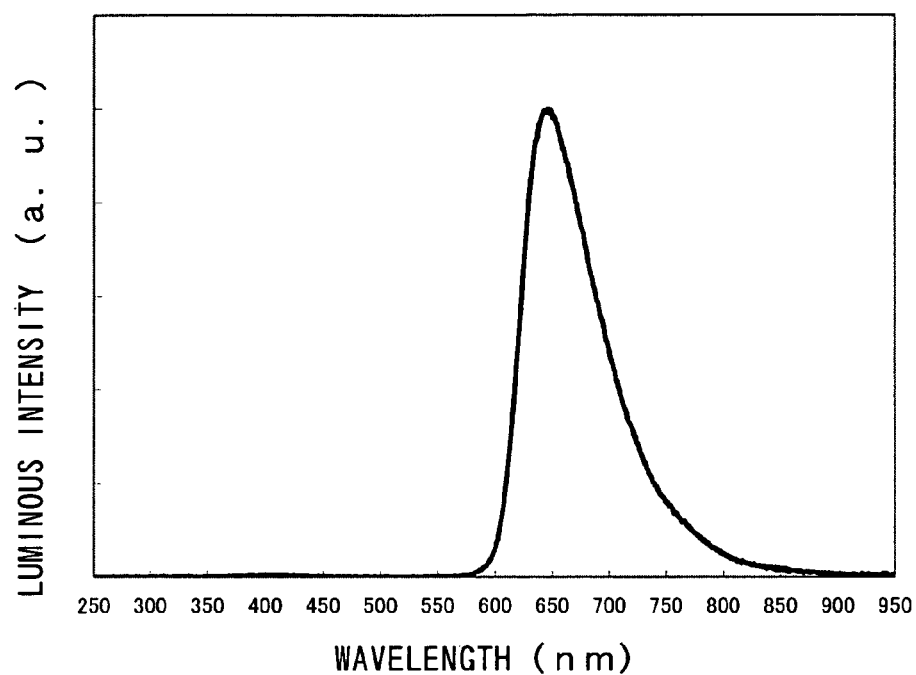
FIG. 11 shows an emission spectrum of a light-emitting element manufactured in Example 5.

10C show measurement results for current density-luminance characteristics, voltage-luminance characteristics, and luminance-current efficiency characteristics, respectively. FIG. 11 shows an emission spectrum of a light-emitting element of Example 5. In addition, the element structures of Example 5 and Example 3 are shown in Table 4.

TABLE 4

| | HOLE INJECTING LAYER [40 nm] | HOLE TRANSPORTING LAYER [20 nm] | HOST MATERIAL OF LIGHT-EMITTING LAYER [30 nm] | ELECTRON TRANSPORTING LAYER [20 nm] | ELECTRON INJECTING LAYER [40 nm] |
|---|---|---|---|---|---|
| EXAMPLE 5 | DNTPD | TCTA | CBP | TAZ | TAZ:Li |
| EXAMPLE 3 | DNTPD | NPB | CBP | TAZ | TAZ:Li |

The light-emitting element of Example 5 needed 9.6 V when emitting light at a luminance of 500 cd/m². The voltage was slightly higher than the voltage needed for the light-emitting element of Example 3. However, the light-emitting element of Example 5 is even more superior in current efficiency and external quantum efficiency than the light-emitting element of Example 3. The current efficiency and the external quantum efficiency thereof at 500 cd/m² were 5.5 cd/A and 12.2%, respectively.

This can be considered to result from TCTA used for the hole transporting layer 212 of the light-emitting element of Example 5, because TCTA has a HOMO level which is closer to a HOMO level of Ir(Fdpq)$_2$(acac) than NPB used in Example 3.

Therefore, it can be seen that the current efficiency and the external quantum efficiency can be increased even more by using for the hole transporting layer, a hole transporting material having a HOMO level closer to a HOMO level of an organometallic complex which is a light-emitting substance.

In addition, it can be seen that the light-emitting element of Example 5 is a red-light emitting element having excellent color purity, since it has a CIE chromaticity coordinate is (X, Y)=(0.71, 0.29). Note that as shown in FIG. 14, the CIE chromaticity coordinate surpasses NTSC standard, and a display device incorporating the light-emitting element of the present invention can display express a variety of colors.

The structure of the light-emitting element of the present invention is not limited to the above structures shown in Example 5, and can be freely combined with Embodiment Modes and the other examples.

Example 6

In Example 6, a light-emitting element and a manufacturing method thereof will be described with reference to FIG. 2. In the light-emitting element, a kind of the organometallic complexes represented by the above-mentioned general formula (6), i.e., (acetylacetonato)bis[2-(4-fluorophenyl)-3-metylquinoxalinato]iridium(III) (Ir(MFpq)$_2$(acac)) is used as a light-emitting substance, BCP having a higher triplet excitation energy than Ir(MFpq)$_2$(acac) is used as an electron transporting layer, and a mixture layer of Alq and Li is used as an electron injecting layer. Note that Ir(MFpq)$_2$(acac) is represented by a formula (21).

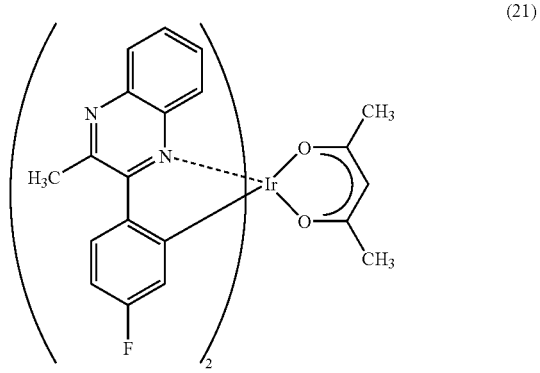

(21)

An ITSO film was formed by a sputtering method over a substrate 100 to form a first electrode 101.

Next, the substrate 100 provided with the first electrode 101 was fixed on a substrate holder provided in a vacuum evaporation apparatus in such a way that a surface provided with the first electrode 101 faced downward.

Over the first electrode 101, a hole injecting layer 111 was formed by co-evaporation of NPB and molybdenum oxide (VI) to have a thickness of 50 nm. Note that the evaporation ratio of NPB to molybdenum oxide (VI) was adjusted to NPB:molybdenum oxide (VI)=4:1.

Then, an NPB film was formed over the hole injecting layer 111, to have a thickness of 10 nm by an evaporation method using resistance heating to form a hole transporting layer 212.

Next, over the hole transporting layer 212, a film of Ir(MFpq)$_2$(acac) and Alq$_3$ was formed to have a thickness of 30 nm by a co-evaporation method to form a light-emitting layer 213. Here, the mass ratio of Alq$_3$ to Ir(MFpq)$_2$(acac) was set to 1:0.08(=Alq$_3$:Ir(MFpq)$_2$(acac)). Thus, Ir(MFpq)$_2$(acac) was dispersed in the film made of Alq$_3$.

Over the light-emitting layer 213, a BCP film was formed to have a thickness of 10 nm by an evaporation method using resistance heating to form an electron transporting layer 214.

Over the electron transporting layer 214, an electron injecting layer 215 was formed to have a thickness of 50 nm by co-evaporation of Alq$_3$ and Li. Here, the mass ratio of Alq$_3$ to Li was set to 1:0.01(=Alq$_3$:Li).

Over the electron injecting layer 215, a second electrode 103 was formed from aluminum by an evaporation method using resistance heating. Then, the light-emitting element obtained as above was sealed in a nitrogen atmosphere.

Figure 15A:
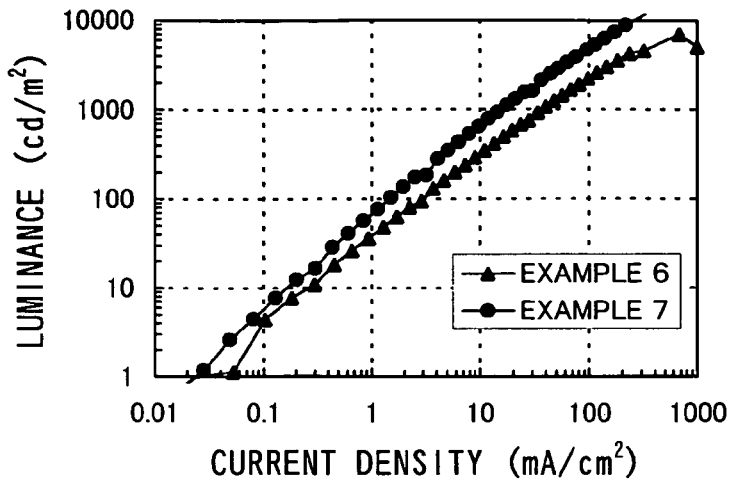
FIGS. 15A to 15C show performance characteristics of light-emitting elements manufactured in Examples 6 and 7.
Figure 15B:
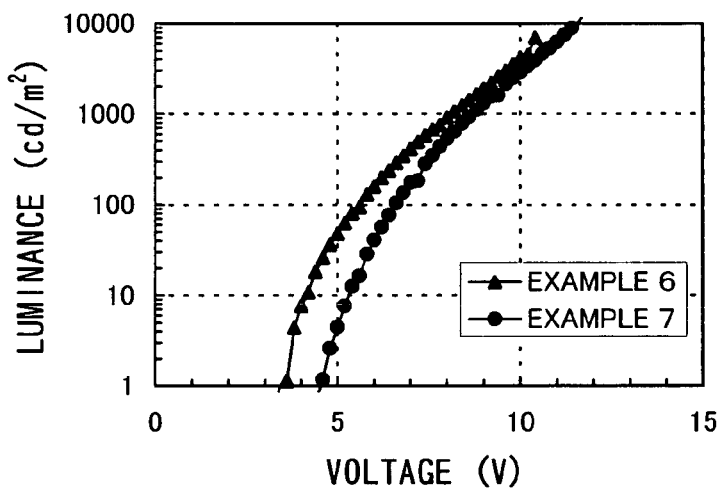
Figure 15C:
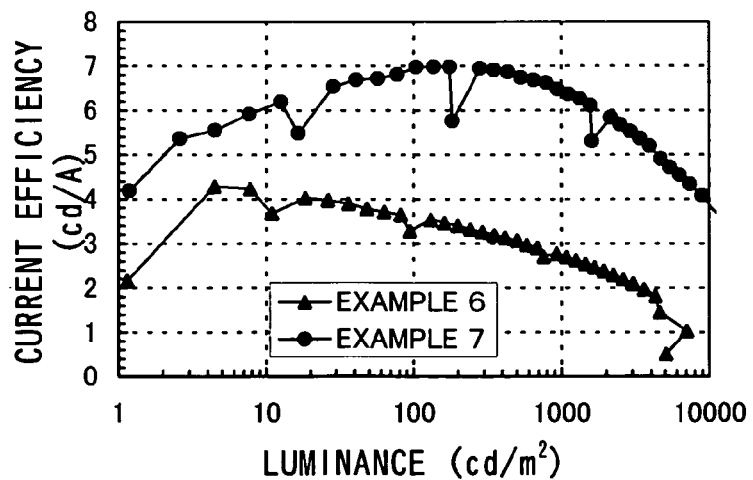
Figure 17:
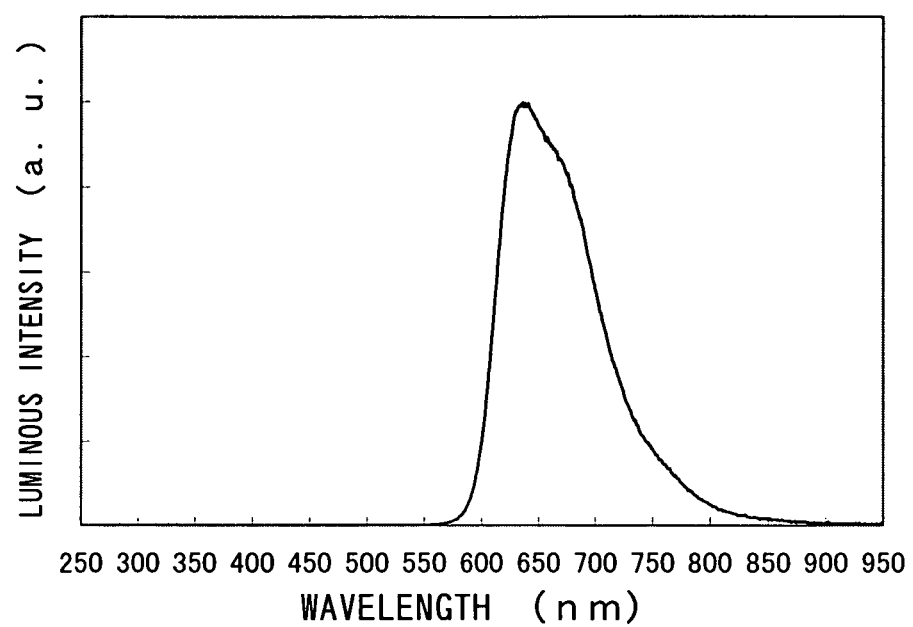
FIG. 17 shows an emission spectrum of a light-emitting element manufactured in Example 7.

Performance characteristics of the light-emitting element of Example 6 were measured by applying a voltage such that a potential of the first electrode 101 became higher than that of the second electrode 103. In addition, the measurement was conducted at a room temperature kept at 25° C. The results are shown in FIGS. 15A to 15C. FIGS. 15A, 15B and 15C show measurement results for current density-luminance characteristics, voltage-luminance characteristics, and luminance-current efficiency characteristics, respectively. In FIG. 15A, the horizontal axis represents current density (mA/cm²)

this example, the measurement results of Example 7 are shown together with the measurement results of Example 6 in FIGS. 15A to 15C, so as to show an effect caused by using different host materials. FIG. 17 shows an emission spectrum of a light-emitting element of Example 7. In addition, the element structures of Example 7 and Example 6 are shown in Table 5.

TABLE 5

Figure 16:
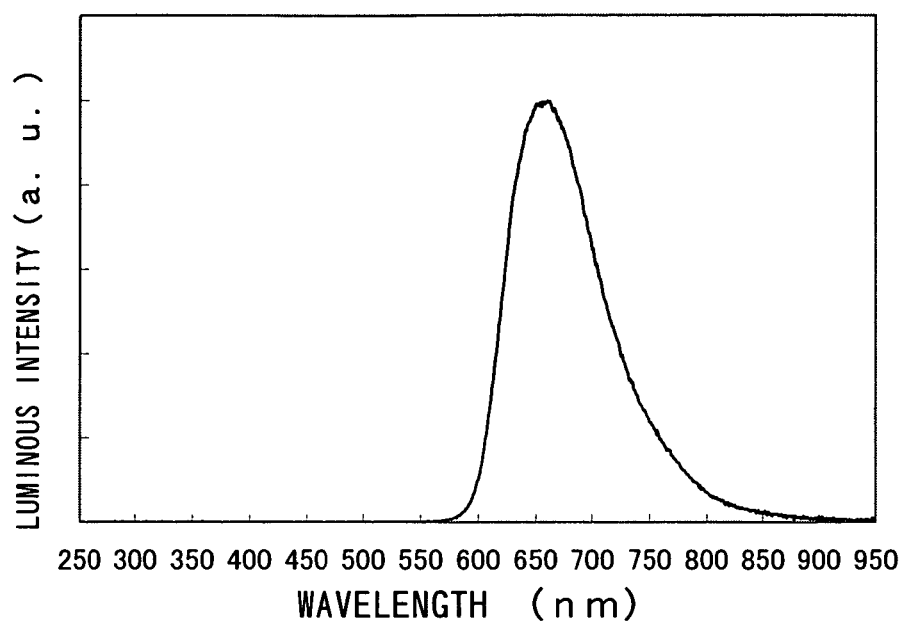
FIG. 16 shows an emission spectrum of a light-emitting element manufactured in Example 6.

|  | HOLE INJECTING LAYER [50 nm] | HOLE TRANSPORTING LAYER [10 nm] | HOST MATERIAL IN LIGHT EMITTING LAYER [30 nm] | ELECTRON TRANSPORTING LAYER [10 nm] | ELECTRON INJECTING LAYER [50 nm] |
|---|---|---|---|---|---|
| EXAMPLE 7 | NPB:MoOx | NPB | CBP | BCP | Alq₃:Li |
| EXAMPLE 6 | NPB:MoOx | NPB | Alq₃ | BCP | Alq₃:Li | and the vertical axis represents luminance (cd/m²). In FIG. 15B, the horizontal axis represents voltage (V) and the vertical axis represents luminance (cd/cm²). In FIG. 15C, the horizontal axis represents luminance (cd/m²) and the vertical axis represents current efficiency (cd/A). FIG. 16 shows an emission spectrum of a light-emitting element of Example 6.

According to the results, it can be seen that the light-emitting element of Example 6 emitted light at a luminance of 500 cd/m², when a voltage of 7.2 V was applied thereto. In addition, the light-emitting element of Example 6 is superior in current efficiency and external quantum efficiency. The current efficiency and the external quantum efficiency thereof at 500 cd/m² were 3.1 cd/A and 7.4%, respectively.

Based upon the foregoing, it can be seen that by introducing Li into the electron injecting layer to increase the amount of electrons injected into the light-emitting layer and by selecting, as the material of the electron transporting layer, a material having a higher triplet excitation energy than an organometallic complex which is a light-emitting substance, a light-emitting element having excellent current efficiency and external quantum efficiency can be obtained.

In addition, the light-emitting element of Example 6 is a red-light emitting element having excellent color purity, since it has a CIE chromaticity coordinate is (X, Y)=(0.71, 0.29). The CIE chromaticity coordinate surpasses NTSC standard, and a display device incorporating the light-emitting element of the present invention can express a variety of colors.

Example 7

In Example 7 a light-emitting element was formed by the same substances and methods as in Example 6, except that a host material of the light-emitting layer was changed as described below. In Example 7, CBP was used as the host material of the light-emitting layer 213. A triplet excitation energy of CBP is higher than those of Ir(MFpq)₂(acac) and Alq₃.

The light-emitting layer 213 was formed to have a thickness of 30 nm by co-evaporation of Ir(MFpq)₂(acac) and CBP. Here, the mass ratio of CBP to Ir(MFpq)₂(acac) was set to 1:0.08(=CBP:Ir(MFpq)₂(acac)). Thus, Ir(MFpq)₂(acac) was dispersed in a film made of CBP.

The light-emitting element formed as above was sealed in a nitrogen atmosphere. After that, performance characteristics of the light-emitting element were measured by applying a voltage such that a potential of the first electrode 101 became higher than that of the second electrode 103. In addition, the measurement was conducted at a room temperature kept at 25° C. The results are shown in FIGS. 15A to 15C. In The light-emitting element in Example 7 needed 8.0 V when emitting light at a luminance of 500 cd/m². The voltage was slightly higher than the voltage needed for the light-emitting element in Example 6. However, the light-emitting element of Example 7 is even more superior in current efficiency and external quantum efficiency than the light-emitting element of Example 6. The current efficiency and the external quantum efficiency thereof at 500 cd/m² were 6.7 cd/A and 12.0%, respectively.

Based upon the foregoing, it can be seen that by selecting, as the host material of the light-emitting layer, a material having a higher triplet excitation energy than an organometallic complex which is a light-emitting substance, the current efficiency and the external quantum efficiency can be more increased.

In addition, it can be seen that the light-emitting element of Example 7 is a red-light emitting element having excellent color purity, since it has a CIE chromaticity coordinate is (X, Y)=(0.70, 0.30). The CIE chromaticity coordinate is larger than NTSC standard, and a display device incorporating the light-emitting element of the present invention can express a variety of colors.

Example 8

In Example 8, a light-emitting element was formed by the same substances and methods as in Example 7, except that (acetylacetonato)bis[2,3-bis(4-trifluoromethylphenyl)quinoxalinato]iridium(III) (Ir(CF₃dpq)₂(acac)) was used as a light-emitting substance. Note that Ir(CF₃dpq)₂(acac) is represented by a formula (22).

(22)

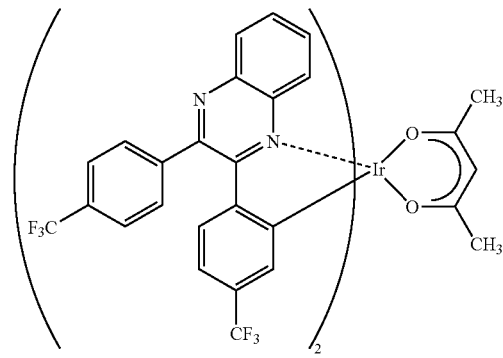

Figure 18A:
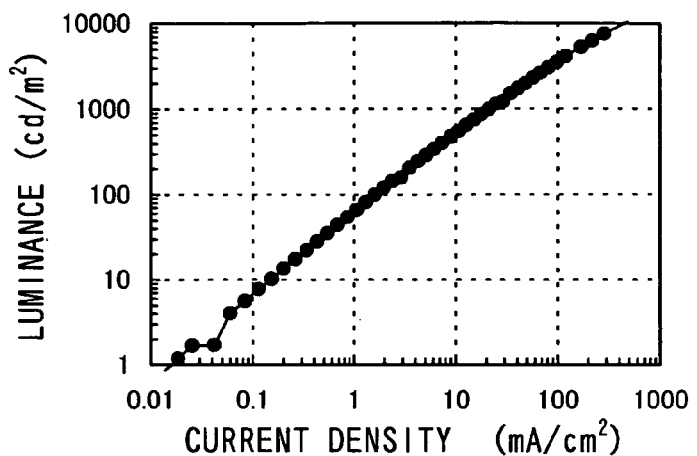
FIGS. 18A to 18C show performance characteristics of a light-emitting element manufactured in Example 8.
Figure 18B:
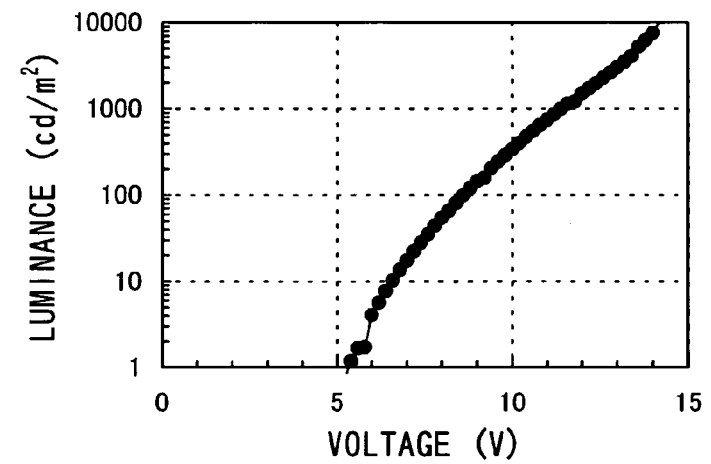
Figure 18C:
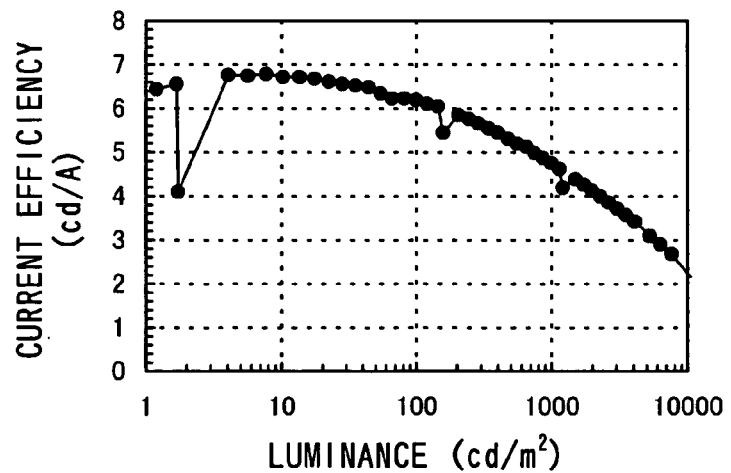
Figure 19:
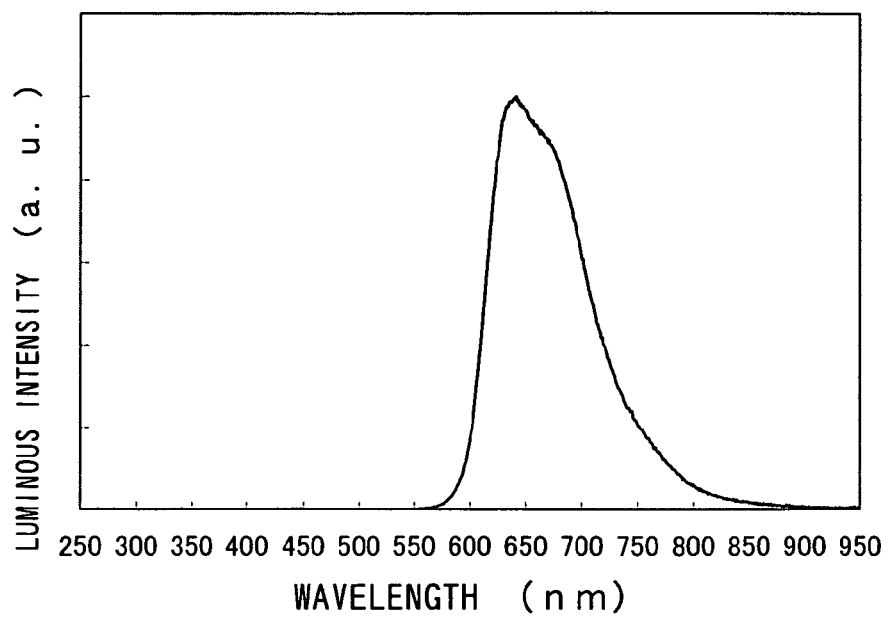
FIG. 19 shows an emission spectrum of a light-emitting element manufactured in Example 8.

Performance characteristics of the light-emitting element of Example 8 were measured by applying a voltage such that a potential of the first electrode 101 became higher than that of the second electrode 103. In addition, the measurement was conducted at a room temperature kept at 25° C. The results are shown in FIGS. 18A to 18C. FIGS. 18A, 18B and 18C show measurement results for current density-luminance characteristics, voltage-luminance characteristics, and luminance-current efficiency characteristics, respectively. In FIG. 18A, the horizontal axis represents current density (mA/cm$^2$) and the vertical axis represents luminance (cd/m$^2$). In FIG. 18B, the horizontal axis represents voltage (V) and the vertical axis represents luminance (cd/cm$^2$). In FIG. 18C, the horizontal axis represents luminance (cd/cm$^2$), and the vertical axis represents current efficiency (cd/A). FIG. 19 shows an emission spectrum of a light-emitting element of Example 8.

According to the results, it can be seen that the light-emitting element of Example 8 emitted light at a luminance of 500 cd/m$^2$, when a voltage of 10.4 V was applied thereto. In addition, the light-emitting element of Example 8 is superior in current efficiency and external quantum efficiency. The current efficiency and the external quantum efficiency thereof at 500 cd/m$^2$ were 5.3 cd/A and 10.0%, respectively.

Based upon the foregoing, it can be seen that by introducing Li into the electron injecting layer to increase the amount of electrons injected into the light-emitting layer and by selecting, as each of the material of the electron transporting layer and the host material of the light-emitting layer, a material having a higher triplet excitation energy than an organometallic complex which is a light-emitting substance, a light-emitting element having excellent current efficiency and external quantum efficiency can be obtained.

In addition, it can be seen that the light-emitting element of Example 8 is a red-light emitting element having excellent color purity, since it has CIE chromaticity coordinate is (X, Y)=(0.70, 0.30). The CIE chromaticity coordinate is larger than NTSC standard, and a display device incorporating the light-emitting element of the present invention can a variety of colors.

Example 9

In Example 9, a light-emitting device which has a light-emitting element of the present invention will be described with a reference to FIGS. 12A and 12B. FIG. 12A is a top view of the light-emitting device, and FIG. 12B is a cross sectional view along A-A' (cross section cut along A-A') in FIG. 12A. Reference numeral 300 denotes a substrate. A portion 301 surrounded by a dotted line is a driver circuit portion (source side driver circuit), reference numeral 302 denotes a pixel portion, and reference numeral 303 denotes a driver circuit portion (gate side driver circuit). In addition, reference numeral 304 denotes a sealing substrate and reference numeral 305 denotes a sealing material. The inside surrounded by the sealing material 305 is a space 306.

Reference numeral 307 denotes a wiring for transmitting signals to be input to the source side driver circuit 301 and the gate side driver circuit 303, and receives signals such as a video signal, a clock signal, a start signal, and a reset signal from a FPC (Flexible Printed Circuit) 308 as an external input terminal. Although only the FPC is shown here, a printed wiring board (PWB) may be attached to the FPC. The category of the light-emitting device in the present invention includes not only light-emitting devices themselves but also light-emitting devices to which an FPC or a PWB is attached, naturally.

Next, the sectional structure will be described with reference to FIG. 12B. The driver circuit portion and the pixel portion are formed over the substrate 300. Here, the source side driver circuit 301 which is one of the driver circuit portions and the pixel portion 302 are shown.

In the source side driver circuit 301, a CMOS circuit in which an n-channel TFT 323 and a p-channel TFT 324 are combined, is formed. The driver circuit constituted by TFTs may be formed with a known CMOS circuit, PMOS circuit, or NMOS circuit. Although this embodiment mode describes the case that driver circuits are formed over the same substrate, the driver circuits are not necessarily formed over the same substrate, and the driver circuits can be formed outside the substrate.

The pixel portion 302 includes plural pixels. Each of the pixels includes a switching TFT 311, a current controlling TFT 312, and a first electrode 313 electrically connected to a drain of the current controlling TFT 312. An insulator 314 is formed to cover an end portion of the first electrode 313. Here, a positive photosensitive acrylic resin film is used to form the insulator 314.

In addition, an upper or lower end portion of the insulator 314 is made to have a curved surface with a curvature in order to improve a coverage of a layer including a light-emitting substance 316 to be formed later. For example, in the case of using positive photosensitive acrylic as a material of the insulator 314, it is preferable that only the upper end portion of the insulator 314 be made to have a curved surface with a curvature radius (0.2 μm to 3 μm). Besides, it is possible to use a negative photosensitive material which is insoluble in an etchant by light or a positive photosensitive material which is soluble in an etchant by light as the insulator 314. Further, not only organic materials but also inorganic materials can be used as the material of the insulator 314, for example, silicon oxide, silicon oxynitride or the like can be used.

Over the first electrode 313, the layer including a light-emitting substance 316 and a second electrode 317 are formed.

The layer including a light-emitting substance 316 is formed by an evaporation method or a coating method. The layer including a light-emitting substance 316 at least includes a light-emitting layer which includes at least one of organometallic complexes having structures represented by the general formulas (1) to (4) and organometallic complexes represented by the general formulas (5) to (8); and either an electron injecting layer having an organic compound and a substance showing an electron donating property to the organic compound or an electron transporting layer, a host, or a hole transporting layer which has a higher triplet excitation energy than the organometallic complex. The stacked structure of other layers is not limited especially, and can be selected as appropriate.

The first electrode 313 serving as an anode, the layer including a light-emitting substance 316 and the second electrode 317 serving as a cathode each can be formed by as appropriate, selecting materials described in Embodiment Mode 1.

The sealing substrate 304 and the substrate 300 are bonded to each other with the sealing material 305, and thus, a structure can be obtained, in which a light-emitting element 318 is provided in the space 306 surrounded by the substrate 300, the sealing substrate 304, and the sealing material 305. The light-emitting element 318 includes the first electrode 313, the layer including a light-emitting substance 316 and the second electrode 317. There is a case that the sealing material 305 fills the space 306, in addition to a case that an inert gas (such as nitrogen or argon) fills the space 306.

It is to be noted that it is preferable to use an epoxy resin for the sealing material 305. Such a material which hardly transmits water and oxygen is preferable. Further, as a material used for the sealing substrate 304, a plastic substrate made of FRP (Fiberglass-Reinforced Plastics), PVF (polyvinyl fluoride), Mylar, polyester, or acrylic can be used as well as a glass substrate and a quartz substrate.

By using a light-emitting element of the present invention which has high luminous efficiency and excellent color purity, a display device which can display colorful images by exhibiting more colors can be obtained.

Example 9 can be freely combined with any one of Embodiment Modes 1 and 2, and Examples 1 to 8.

The present invention is not limited to Examples described above.

Example 10

Example 10 will describe various electronic devices each including a light-emitting device formed using a light-emitting element of the present invention. Since such light-emitting devices to which the present invention is applied, each use a red-light emitting element having high luminous efficiency and excellent color purity, colorful emission can be obtained.

Electronic devices manufactured using a light-emitting device having a light-emitting element of the present invention are, for example, TV set, cameras such as video cameras or digital cameras, goggle type displays (head mounted displays), navigation systems, sound reproduction devices (such car audios or audio components), personal computers such as laptop computers, game machines, portable information terminals (such as mobile computers, cell phones, portable game machines, or electronic books), image reproduction devices utilizing a recording medium (specifically, such as devices which can reproduce a recording medium such as a digital versatile disk (DVD) and are equipped with a display device capable of displaying the image) and the like. These electronic devices are specifically shown in FIGS. 13A to 13D. The electronic devices of using a light-emitting device of the present invention are not limited to these examples.

FIG. 13A shows a display device which includes a casing 400, a supporting stand 401, a display portion 402, speaker portions 403, a video input terminal 404, and the like. The display device is manufactured by using a light-emitting device having a light-emitting element of the present invention for the display portion 402. It is to be noted that the category of the display device includes all types of information display devices, e.g., display devices for a computer, display devices for TV broadcast reception, display devices for advertisement display, and so on.

A light-emitting element of the present invention is provided in the display portion 402. A layer including a light-emitting substance included in the light-emitting element at least includes a light-emitting layer which includes at least one of organometallic complexes having structures represented by the general formulas (1) to (4) and organometallic complexes represented by the general formulas (5) to (8); and an electron injecting layer having an organic compound and a substance showing an electron donating property to the organic compound, an electron transporting layer, a host or a hole transporting layer. The electron transporting layer, the host or the hole transporting layer has a higher triplet excitation energy than the organometallic complex. By using the light-emitting element of the present invention, a display device which can exhibit colorful images can be obtained.

FIG. 13B shows a laptop personal computer which includes a main body 500, a casing 501, a display portion 502, a keyboard 503, an external connection port 504, a pointing mouse 505, and the like.

A light-emitting element of the present invention is provided in the display portion 502. A layer including a light-emitting substance included in the light-emitting element at least includes a light-emitting layer which includes at least one of organometallic complexes having structures represented by the general formulas (1) to (4) and organometallic complexes represented by the general formulas (5) to (8); and an electron injecting layer having an organic compound and a substance showing an electron donating property to the organic compound, an electron transporting layer, a host or a hole transporting layer. The electron transporting layer, the host or the hole transporting layer has a higher triplet excitation energy than the organometallic complex. By using the light-emitting element of the present invention, a personal computer which can exhibit colorful images can be obtained.

FIG. 13C shows a video camera which includes a main body 600, a display portion 601, a casing 602, an external connection port 603, a remote control receiving portion 604, an image receiving portion 605, a battery 606, an audio input portion 607, operation keys 608, an eyepiece portion 609, and the like.

A light-emitting element of the present invention is provided in the display portion 601. A layer including a light-emitting substance included in the light-emitting element at least includes a light-emitting layer which includes at least one of organometallic complexes having structures represented by the general formulas (1) to (4) and organometallic complexes represented by the general formulas (5) to (8); and an electron injecting layer having an organic compound and a substance showing an electron donating property to the organic compound, an electron transporting layer, a host or a hole transporting layer. The electron transporting layer, the host or the hole transporting layer has a higher triplet excitation energy than the organometallic complex. By using the light-emitting element of the present invention, a video camera which can exhibit colorful images can be obtained.

FIG. 13D shows a cell phone which includes a main body 700, a casing 701, a display portion 702, an audio input portion 703, an audio output portion 704, operation keys 705, an external connection port 706, an antenna 707, and the like.

A light-emitting element of the present invention is provided in the display portion 702. A layer including a light-emitting substance included in the light-emitting element at least includes a light-emitting layer which includes at least one of organometallic complexes having structures represented by the general formulas (1) to (4) and organometallic complexes represented by the general formulas (5) to (8); and an electron injecting layer having an organic compound and a substance showing an electron donating property to the organic compound, an electron transporting layer, a host or a hole transporting layer. The electron transporting layer, the host or the hole transporting layer has a higher triplet excitation energy than the organometallic complex. By using the light-emitting element of the present invention, a cell phone having a display portion which can exhibit colorful images can be obtained.

As described above, the present invention can be applied in an extremely wide range, and can be applied to display devices of every field. Such electronic devices shown in Example 10 can be freely combined with any structure shown Embodiment Modes 1 and 2, and Examples 1 to 9, as appropriate.

The present application is based on Japanese Patent Application serial No. 2005-148787 filed on May 20, 2005 in Japanese Patent Office, the entire contents of which are hereby incorporated by reference.

What is claimed is:

1. A light-emitting element comprising:
a hole injecting layer, a hole transporting layer, a light-emitting layer, an electron transporting layer, an electron injecting layer, and a second electrode which are stacked sequentially over a first electrode;
wherein the light-emitting layer comprises a host material and an organometallic complex having a structure represented by a general formula (6),

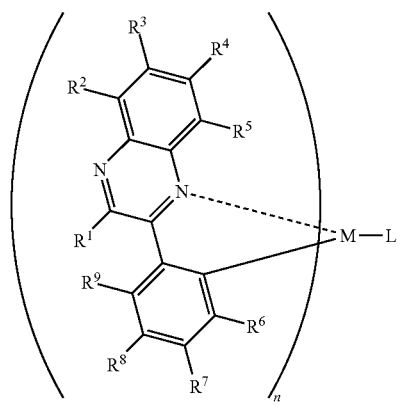

(6)

wherein the hole injecting layer comprises a mixture of a molybdenum oxide and an aromatic amine based compound,
wherein the electron injecting layer comprises an organic compound and a substance showing an electron donating property to the organic compound,
wherein the host material has a triplet excitation energy higher than the organometallic complex,
wherein the substance showing an electron donating property to the organic compound is lithium, and
wherein $R^1$ is a methyl group; $R^2$ to $R^5$ is selected from the group consisting of hydrogen, a halogen element, an acyl group, an alkyl group, an alkoxyl group, an aryl group, a cyano group, and a heterocyclic group; $R^6$ to $R^9$ is hydrogen or a halogen element; at least one of $R^6$ to $R^9$ represents a fluorine atom; M is iridium; n=2; and L is a monoanionic ligand.

2. The light-emitting element according to claim 1, wherein the monoanionic ligand L is any one of ligands represented by formulas (9) to (15)

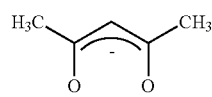

(9)

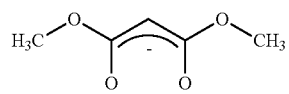

(10)

-continued

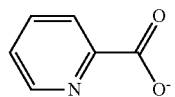

(11)

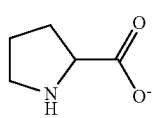

(12)

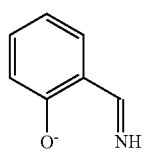

(13)

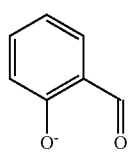

(14)

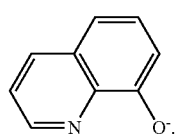

(15)

3. The light-emitting element according to claim 1, wherein the monoanionic ligand L represents either a monoanionic ligand having a beta-diketone structure, or a monoanionic bidentate ligand having a carboxyl group, or a monoanionic bidentate ligand having a phenolic hydroxyl group.

4. The light-emitting element according to claim 1, wherein the hole transporting layer has a triplet excitation energy higher than the organometallic complex.

5. The light-emitting element according to claim 1, wherein the aromatic amine based compound is 4,4'-bis[N-(1-naphthyl)-N-phenyl-amino]-biphenyl.

6. A display device comprising the light-emitting element according to claim 1.

7. A light-emitting element comprising:
a hole injecting layer over a first electrode;
a hole transporting layer over the hole injecting layer;
a light-emitting layer over the hole transporting layer;
an electron transporting layer over the light-emitting layer; and
an electron injecting layer over the electron transporting layer,
wherein the light-emitting layer comprises a first organic compound and an organometallic complex having a structure represented by a general formula (6),

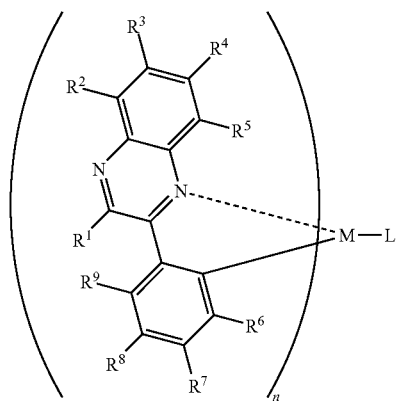

(6)

wherein the electron injecting layer comprises a second organic compound and lithium, and wherein $R^1$ is a methyl group; $R^2$ to $R^5$ are hydrogen; $R^6$, $R^8$, and $R^9$ are hydrogen; $R^7$ is a fluorine atom; M is iridium; n=2; and L is a monoanionic ligand.

8. The light-emitting element according to claim 7, wherein the monoanionic ligand L is any one of formulas (9) to (15),

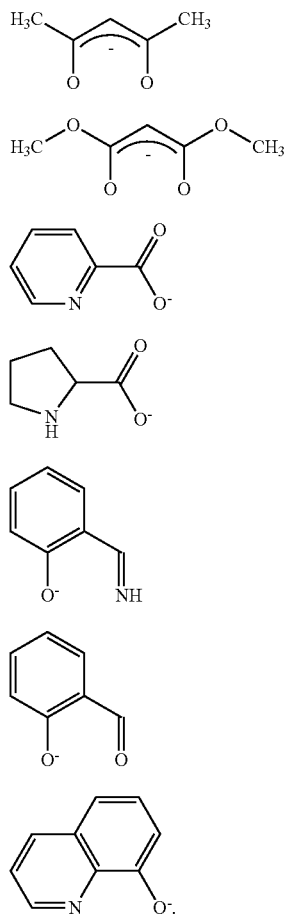

(9)
(10)
(11)
(12)
(13)
(14)
(15)

9. The light-emitting element according to claim 7, wherein the monoanionic ligand L represents either a monoanionic ligand having a beta-diketone structure, or a monoanionic bidentate ligand having a carboxyl group, or a monoanionic bidentate ligand having a phenolic hydroxyl group.

10. The light-emitting element according to claim 7,
wherein the electron transporting layer comprises a third organic compound,
wherein the first organic compound and the second organic compound are same organic compound, and
wherein the third organic compound is different from the first organic compound and the second organic compound.

11. The light-emitting element according to claim 10,
wherein the first organic compound and the second organic compound are tris(8-quinolinolato)aluminum, and
wherein the third organic compound is bathocuproin.

12. A display device comprising the light-emitting element according to claim 7.

13. A light-emitting element comprising:
a hole injecting layer over a first electrode;
a hole transporting layer over the hole injecting layer;
a light-emitting layer over the hole transporting layer;
an electron transporting layer over the light-emitting layer; and
an electron injecting layer over the electron transporting layer,
wherein the light-emitting layer comprises a first organic compound and an organometallic complex having a structure represented by a general formula (6),

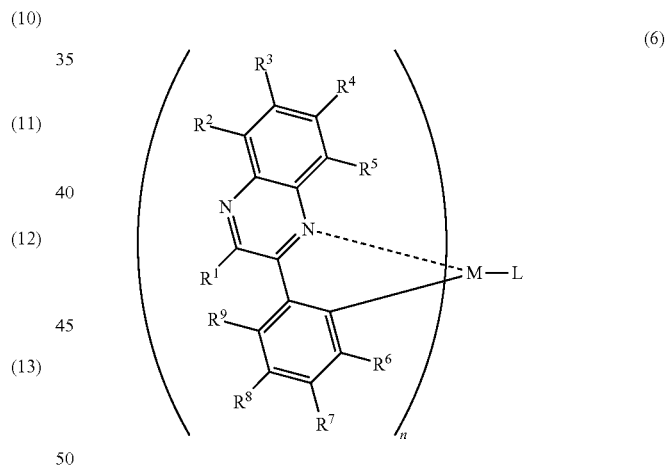

(6)

wherein the electron injecting layer comprises a second organic compound and a substance showing an electron donating property to the organic compound, and wherein $R^1$ is a methyl group; $R^2$ to $R^5$ are hydrogen; $R^6$, $R^8$, and $R^9$ are hydrogen; $R^7$ is a fluorine atom; M is iridium; n=2; and L is a monoanionic ligand.

14. The light-emitting element according to claim 13, wherein the monoanionic ligand L is any one of formulas (9) to (15),

(9)

(10)
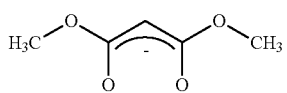

(11)
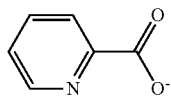

(12)
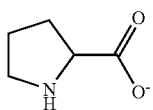

(13)
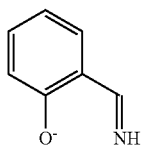

(14)
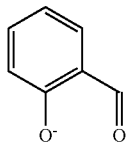

(15)
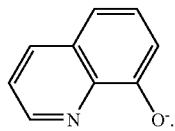

15. The light-emitting element according to claim 13, wherein the monoanionic ligand L represents either a monoanionic ligand having a beta-diketone structure, or a monoanionic bidentate ligand having a carboxyl group, or a monoanionic bidentate ligand having a phenolic hydroxyl group.

16. The light-emitting element according to claim 13, wherein the electron transporting layer comprises a third organic compound,
wherein the first organic compound and the second organic compound are same organic compound, and
wherein the third organic compound is different from the first organic compound and the second organic compound.

17. The light-emitting element according to claim 16, wherein the first organic compound and the second organic compound are tris(8-quinolinolato)aluminum, and
wherein the third organic compound is bathocuproin.

18. A display device comprising the light-emitting element according to claim 13.

* * * * *